(12) United States Patent
Frampton et al.

(10) Patent No.: US 10,823,772 B2
(45) Date of Patent: Nov. 3, 2020

(54) GENERATOR WAVEFORM MEASUREMENT

(71) Applicant: Kohler Co., Kohler, WI (US)

(72) Inventors: Isaac S. Frampton, Strattanville, PA (US); Douglas W. Dorn, Sheboygan Falls, WI (US)

(73) Assignee: Kohler Co., Kohler, WI (US)

( * ) Notice: Subject to any disclaimer, the term of this patent is extended or adjusted under 35 U.S.C. 154(b) by 0 days.

(21) Appl. No.: 16/410,465

(22) Filed: May 13, 2019

(65) Prior Publication Data

US 2019/0265284 A1    Aug. 29, 2019

Related U.S. Application Data

(63) Continuation of application No. 15/238,239, filed on Aug. 16, 2016, now Pat. No. 10,338,119.

(51) Int. Cl.
*G01R 25/00* (2006.01)
*G01R 31/34* (2020.01)
*G01R 1/28* (2006.01)
*H02J 3/38* (2006.01)
*G01R 19/02* (2006.01)
*H02J 3/40* (2006.01)

(52) U.S. Cl.
CPC .............. *G01R 25/005* (2013.01); *G01R 1/28* (2013.01); *G01R 19/02* (2013.01); *G01R 31/34* (2013.01); *G01R 31/343* (2013.01); *H02J 3/38* (2013.01); *H02J 3/40* (2013.01)

(58) Field of Classification Search
CPC ......... G01R 25/005; G01R 1/28; G01R 19/02
See application file for complete search history.

(56) References Cited

U.S. PATENT DOCUMENTS

| 5,497,332 A | 3/1996 | Allen et al. |
| 5,587,917 A | 12/1996 | Elms |
| 6,018,318 A | 1/2000 | Schodlbauer |

(Continued)

FOREIGN PATENT DOCUMENTS

| CN | 1867813 A | 11/2006 |
| CN | 201846297 U | 5/2011 |

(Continued)

OTHER PUBLICATIONS

European Search Report for related European Application No. 17183633.1 dated Jan. 5, 2018.

(Continued)

*Primary Examiner* — Marc Anthony Armand
(74) *Attorney, Agent, or Firm* — Lempia Summerfield Katz LLC

(57) ABSTRACT

A generator waveform is measured using one or more techniques that reduce the computing resources for measuring the generator waveform and the time required for measuring the generator waveform. One example includes a template matching technique that iteratively selects templates to estimate the phase offset of the generator waveform. One example includes a root mean squared value calculated from less than sample time period that is less than one half of a cycle of the generator waveform. A generator controller calculates a command or parameter for the generator based on the estimated phase offset or the root mean squared value.

15 Claims, 19 Drawing Sheets

(56) References Cited

U.S. PATENT DOCUMENTS

| | | | |
|---|---|---|---|
| 6,158,416 A * | 12/2000 | Chen | F02D 31/009 |
| | | | 123/380 |
| 7,042,110 B2 | 5/2006 | Mikhail | |
| 7,233,129 B2 | 6/2007 | Erdman et al. | |
| 8,587,351 B1 | 11/2013 | Crandall | |
| 2004/0075424 A1 * | 4/2004 | Chadwick | H02M 7/53873 |
| | | | 324/76.12 |
| 2004/0263147 A1 | 12/2004 | Piesinger | |
| 2007/0262768 A1 | 11/2007 | Holdsclaw | |
| 2008/0157538 A1 | 7/2008 | Lewis | |
| 2008/0258692 A1 | 10/2008 | Heinz et al. | |
| 2009/0108676 A1 | 4/2009 | Algrain | |
| 2009/0292848 A1 | 11/2009 | Robinson et al. | |
| 2012/0016531 A1 | 1/2012 | Ganev | |
| 2012/0084030 A1 | 4/2012 | Kitagawa et al. | |
| 2013/0113457 A1 | 5/2013 | Albsmeier et al. | |
| 2015/0318705 A1 | 11/2015 | Lucas et al. | |

FOREIGN PATENT DOCUMENTS

| | | |
|---|---|---|
| CN | 102187542 A | 9/2011 |
| CN | 102369493 A | 3/2012 |
| CN | 102445346 A | 5/2012 |
| CN | 103439590 A | 12/2013 |
| CN | 103558513 A | 2/2014 |
| CN | 103842828 A | 6/2014 |
| CN | 105162169 A | 12/2015 |
| CN | 105680484 A | 6/2016 |
| EP | 2408079 A2 | 1/2012 |
| JP | 2015215195 A | 12/2015 |
| KR | 101462439 B1 | 11/2014 |
| WO | WO2005083626 A2 | 9/2005 |
| WO | WO2010036974 A2 | 4/2010 |
| WO | WO2013067144 A1 | 5/2013 |

OTHER PUBLICATIONS

Flynn, Damian, ed. Thermal Power Plant Simulation and Control. No. 43. IET, 2003.

Ghosh A K et al, "The Classification of Power System Disturbance Waveforms Using a Neural Network Approach" Proceedings of the Power Engineering Society Transmission and Distribution Conference, Apr. 10, 1994, pp. 323-329.

Shtargot, J. "Advanced Power-Line Monitoring Requires a High-Performance Simultaneous-Sampling ADC." MAXIM Application Note 4281, 2008.

Chinese Office Action for Chinese Patent Application No. 201710686978.1, dated Sep. 16, 2019.

Chinese Office Action for Chinese Application No. 201110686978.1 dated Jun. 23, 2020.

* cited by examiner

GENERATOR WAVEFORM MEASUREMENT

CROSS REFERENCE TO OTHER APPLICATIONS

This application is a continuation under 35 U.S.C § 120 and 37 C.F.R. § 1.53(b) of U.S. patent application Ser. No. 15/238,239 filed Aug. 16, 2016, which is hereby incorporated by reference in its entirety.

TECHNICAL FIELD

This disclosure relates in general to the measurement of one or more electrical parameters or waveforms for a generator.

BACKGROUND

An engine-generator set, which may be referred to as a generator or a genset, may include a power source (e.g., an engine) and an alternator or another device for generating electrical energy or power from mechanical energy. The generator may provide backup power in the event of a break in power utility service. Other generator customers may be reliant on the generators for a primary source of power.

Both these prime power installations and backup installations may include multiple generators that may be paralleled or synchronized. When one of the parallel generators goes offline, the other generators may attempt to compensate or otherwise mitigate the failure. For example, the other generators may deactivate paralleled controls and operate individually based on a present load on the system. The synchronization of the generators requires measurement of the electrical parameters of the output of one or more of the generators. In addition, the output of a generator may be measured in operation for maintenance or control of the system. Challenges remain in improving techniques for the measurement of waveforms in generator systems.

BRIEF DESCRIPTION OF THE DRAWINGS

Exemplary implementations are described herein with reference to the following drawings.

DETAILED DESCRIPTION

A variety of feedback control systems or operational algorithms in generator systems utilize generator waveform measurements. Examples include phase identification, generator paralleling or synchronization, power facture calculation, reactive power calculation, generator monitoring, troubleshooting, and other examples.

Phase identification includes techniques and algorithms for identification phases in a multiphase system. Phase identification may determine an order for three phases in a three phase system. Phase identification may identify which of three outputs (e.g., phase A, phase B, phase C) corresponds to specific phases in the generator system. Phase identification may determine which of multiple outputs of a generator should be connected to particular phases of a bus, a load, or another generator.

In generator paralleling or synchronization, the speed or frequency of one generator is matched to the speed or frequency at a bus or another generator. The waveforms are measured in order to control the generator to have the same voltage, frequency, phase sequence, and phase angle as the other generator or bus.

The generator waveform measurement may be used to determine the sign of the reactive power. Reactive power can be calculated as the square root of the difference of the squares of real power and apparent power (e.g., the vector for the apparent power is a hypotenuse of a right triangle having vectors for the real power and reactive power as legs, where the sum of squares of the lengths of the legs equals the square of the length of the hypotenuse). Because the reactive power is calculated from a square (i.e., by calculating a square root), the sign, for whether the value for reactive power is positive or negative, is ambiguous. The sign of the reactive power, to determine whether the generator voltage leads or lags the generator current, may be calculated from the generator waveform measurements including offset angle described herein. A positive offset angle corresponds to current that lags the voltage, and a negative offset angle to current that leads the voltage.

The calculation of the sign of reactive power may be particularly challenging when prominent harmonics are present in the output. With harmonics, signals in the output may be three times, five times, or another multiple of the fundamental frequency. These harmonic signals cause the current to appear to both lag and lead the voltage when using zero-crossings to determine phase between current and voltage because current zero crossing occur both before and after the voltage zero crossing. However, the phase offset of generator waveform templates described herein is based only on the fundamental frequency regardless of the number and magnitude of other harmonics.

Figure 1:
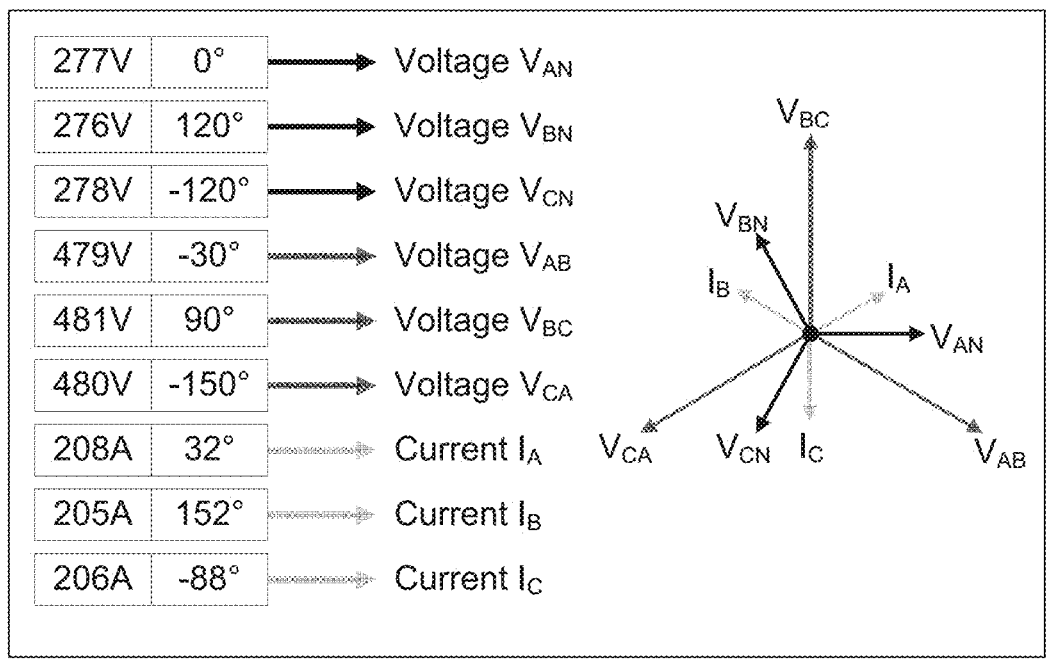
FIG. 1 illustrates an example phasor diagram.

In other examples, the generator waveform may be monitored to present a graphical diagram (e.g., phasor diagram)

to the user to illustrate a relationship between the current and the voltage of the output of the generator. An example phasor diagram is illustrated in FIG. 1. The phasor diagram may include a two-dimensional or three-dimensional diagram including a vector for the current and a vector for the voltage. An angle between the current vector and the voltage vector may be determine based on the phase angle. The phasor diagram indicates whether the current leads or lags the voltage, and vice versa, and a magnitude by which the current leads or lags the voltage.

The generator waveform may be measured in order to monitor the generator or generator system. The output waveform of the generator may be monitored to identify abnormalities in the output. The abnormalities may include an output voltage or current below a threshold, an output voltage or current above a threshold, or a threshold change in frequency. Troubleshooting of the generator system may be performed based on the detection of these abnormalities in order to identify a malfunction component of the generator system.

The following embodiments present techniques for measuring the generator waveform. In these techniques, specific algorithms are applied to the output of the generator system in order to minimize the computing resources required to measure the generator waveform. For example, in some techniques few samples of the generator output are required in order to produce a reliable and accurate measurement of the generator waveform. In other examples, only a short sample time, which is less than a cycle of the signal, is needed in order to produce a reliable and accurate measurement of the generator waveform.

Figure 2:
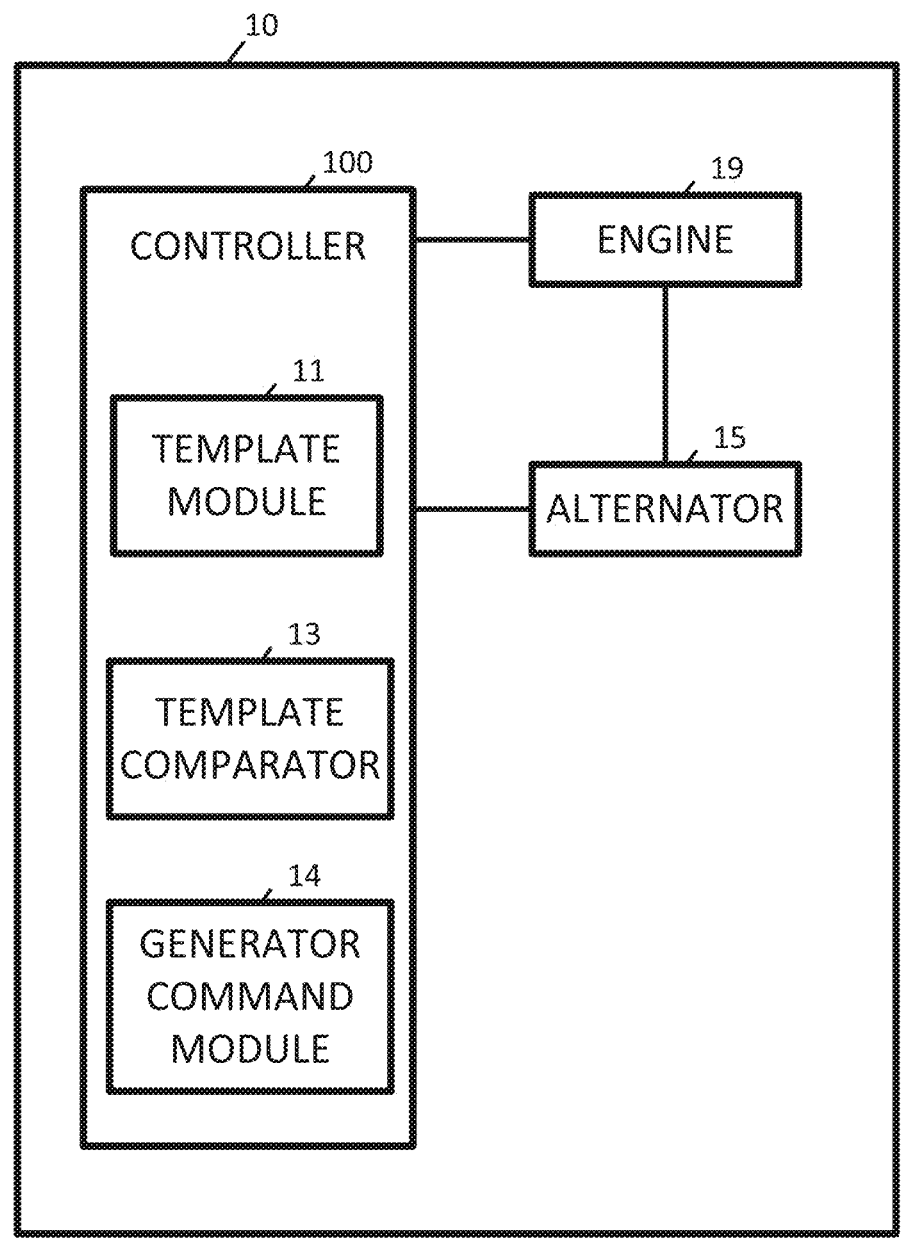
FIG. 2 illustrates an example generator.

FIG. 2 illustrates an example generator 10 including an alternator 15, an engine 19, and a controller 100 including a template module 11, a template comparator 13, and a generator command module 14. The template module 11 may include hardware or circuitry for generating and storing the templates including a waveform generator as a stand-alone piece of hardware or an integrated circuit specifically designed to produce waveforms and specific amplitudes, frequencies, and/or phase offsets. The template comparator 13 may include hardware or a comparator circuitry including one or more operational amplifiers and resistors with resistance values selected to compare one voltage to another voltage. The generator command module 14 may include hardware or circuitry for generating generator commands. The command module circuitry may be a digital or analog circuit that receives an input of the selected template from the template comparator 13 and outputs a command for the generator system. Additional different or fewer components may be included.

The engine 19 may include one or more cylinders and a combustion chamber that receives fuel and combusts the fuel to move the cylinders in a reciprocal motion to rotate a shaft mechanically coupled to the alternator 15. The fuel may be gasoline, compressed natural gas, propane or another example fuel. The controller 100 may provide an ignition control signal (e.g., spark module signal) for initiating the combustion in the combustion chamber for causing the reciprocal motion. The alternator 15 may be a controlled field alternator in which a field current is actively controlled by the controller 100 to adjust the output (e.g., amplitude, current, frequency or phase) of the alternator 15. In addition, controller 100 may control protective functions of the generator or merely be responsible for metering the output from the alternator. The alternator 15 may be configured to generate a poly-phase signal or a single phase signal. As the field portion of the alternator is rotated relative to the armature, a magnetic flux is passed through and across the alternator armature windings producing time varying voltage. The output of the alternator 15 may be a three phase signal. The phases of the poly-phase signal may be offset from one another by a predetermined angle (e.g., 120 degrees or 2*Pi/3 radians). The poly-phase signal may vary with respect to amplitude and frequency.

The template comparator 13 of the controller 100 compares a measured generator waveform to one or more templates of a generator waveform generated by or stored by the template module 11. The measured generator waveform may correspond to the output of the alternator 15. The output may include one or more voltage waveforms, one or more current waveforms, or one or more power waveforms.

The controller 100 is configured to identify the measured generator waveform and perform a discrete analysis on the generator waveform. For example, the controller 100 may include a sampling circuit including a timer and a sensor that determines sample values of the generator waveform at a predetermined time interval. The sampling circuit may be an analog to digital conversion circuit, such as a Sigma-delta or successive approximation register. It may also be an analog sample and hold circuit including a capacitor, and a switch among other techniques. The capacitor may be connected to the incoming signal only at certain times by the switch.

The template module 11 may include various templates that correspond to predetermined phase angles for the generator waveform. In some examples, the templates are generated on the fly by the controller 100. In other examples, the template module 11 includes templates at specific frequencies and specific phase angles. In either example, the template module 11 may associate a phase angle value with each of the templates.

Figure 3:
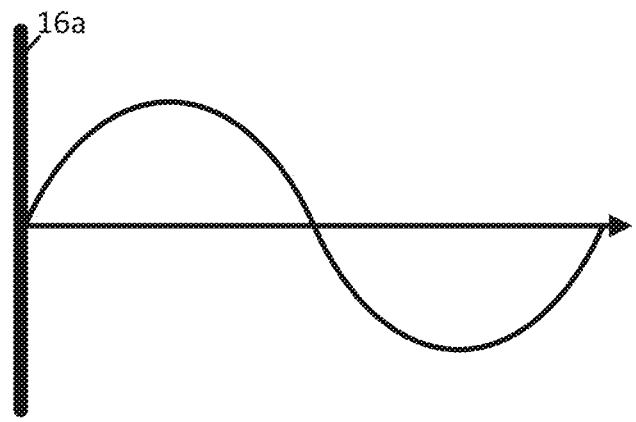
FIG. 3 illustrates an example set of templates for measurement of generator waveforms.
Figure 3:
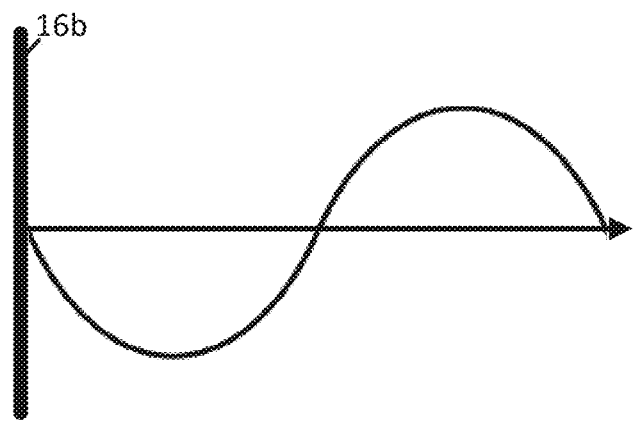

The template comparator 13 of the controller 100 is configured to perform an iterative series of comparisons between the measured generator waveform and multiple sets of templates. The first iteration of templates may include any number of templates. FIG. 3 illustrates an example set of two templates 16a and 16b for measurement of generator waveforms. In this example the two templates are 180 degrees out of phase (e.g., template 16a has a phase offset of 0 degrees and template 16b has a phase offset of 180 degrees) to one another, but the templates may be separated in phase angle by any value.

The controller 100 performs a first comparison of a first set of phase templates or waveform templates to a result of the discrete analysis of the generator waveform. The comparison includes a comparison of sample values from the measured generator waveform to values from the first set of phase templates. The controller 100 may identify a first array $A_1$ of values for the measured generator waveform and identify second and third arrays $B_1$ and $B_2$ of values for the first set of templates for the waveform:

$A_1$=[X1, X2, X3, X4, X5];
$B_1$=[Y1, Y2, Y3, Y4, Y5];
$B_2$=[Z1, Z2, Z3, Z4, Z5].

The controller 100 is configured to determine a difference array $A_1$-$B_1$ for difference between the first array $A_1$ and the second array $B_1$ and a difference array $A_1$-$B_2$ for difference between the first array $A_1$ and the third array $B_2$. The differences may be absolute values.

$A_1$-$B_1$=[X1-Y1, X2-Y2, X3-Y3, X4-Y4, X5-Y5];
$A_1$-$B_2$=[X1-Z1, X2-Z2, X3-Z3, X4-Z4, X5-Z5].

The controller 100 may be configured to calculate a magnitude or component sum $A_1B_1$ for the difference array $A_1$-$B_1$ and a magnitude or component sum $A_1B_2$ of the difference array $A_1$-$B_2$. The component sums may include a sum of each vector of the components of the difference arrays:

$A_1B_1$=[X1-Y1+X2-Y2+X3-Y3+X4-Y4+X5-Y5];
$A_1B_2$=[X1-Z1+X2-Z2+X3-Z3+X4-Z4+X5-Z5].

The magnitude of the difference arrays may include a square root (sqrt) of a sum of squares of the vector components of the difference arrays:

$|A_1B_1|$=sqrt((X1-Y1)²+(X2-Y2)²+(X3-Y3)²+(X4-Y4)²+(X5-Y5)²);
$|A_1B_2|$=sqrt(X1-Z1)²+(X2-Z2)²+(X3-Z3)²+(X4-Z4)²+(X5-Z5)²).

The controller 100 may be configured to select one of the first set of phase templates based on the first comparison. The controller 100 may select the template that is closest to the measured generator waveform. For example, the controller 100 may compare the magnitudes of the difference arrays. For example, for a measured generator waveform associated with array $A_1$, when $|A_1B_1|$ is smaller than $|A_1B_2|$, the controller 100 selects the template associated with array $B_1$, and when $|A_1B_1|$ is larger than $|A_1B_2|$, the controller 100 selects the template associated with array $B_2$.

The controller 100 may iteratively perform one or more additional comparisons with the measured generator waveform. A second iteration may be determined based on a result of the first iteration. In the example above, when $|A_1B_1|$ is smaller than $|A_1B_2|$, the controller 100 may select a first set of secondary templates, and when $|A_1B_1|$ is larger than $|A_1B_2|$, the controller 100 may select a second set of secondary templates.

The controller 100 may be configured to perform an iterative series of comparisons between the measured generator waveform and multiple set of templates based on the result of the discrete analysis of the generator waveform. The controller 100 may perform a first comparison of a first set of phase templates to a result of the discrete analysis of the generator waveform. The comparison may include a comparison of sample values from the measured generator waveform to values from the each of the secondary set of phase templates. The controller 100 may be configured to determine a difference array based on the measured generator waveform and each of the secondary set of phase templates. The controller 100 may calculate a magnitude of the difference arrays as a square root (sqrt) of a sum of squares of the vector components of the difference arrays or component sum of the vector components. The controller 100 may be configured to select one of the secondary phase templates based on the comparison. The controller 100 may select the template that is closest to the measured generator waveform, and the sequence may repeat for one or more iterations.

The controller 100 may choose each phase template at a midpoint between the two previously compared templates with the lowest difference. The previous midpoint template may become one of the end templates for a subsequent midpoint template determination. Midpoint templates may be chosen, iteratively, until a desired precision is reached for the measured quantity.

The controller 100 may identify a characteristic value for the generator waveform based on the selected one of the second set of phase templates. The controller 100 may access the phase angle value from the template module 11 and assign the phase angle value as the characteristic value for the measured generator waveform.

The generator command module 14 of the controller 100 may calculate a generator parameter based on characteristic value from the selected on of the second set of phase templates. The generator parameter may include the phase angle for the measured generated waveform, a power factor for the measured generated waveform, a reactive power value for the measured generated waveform, a user diagram for the measured generated waveform, or a generator command based on the measured generated waveform.

Figure 4:
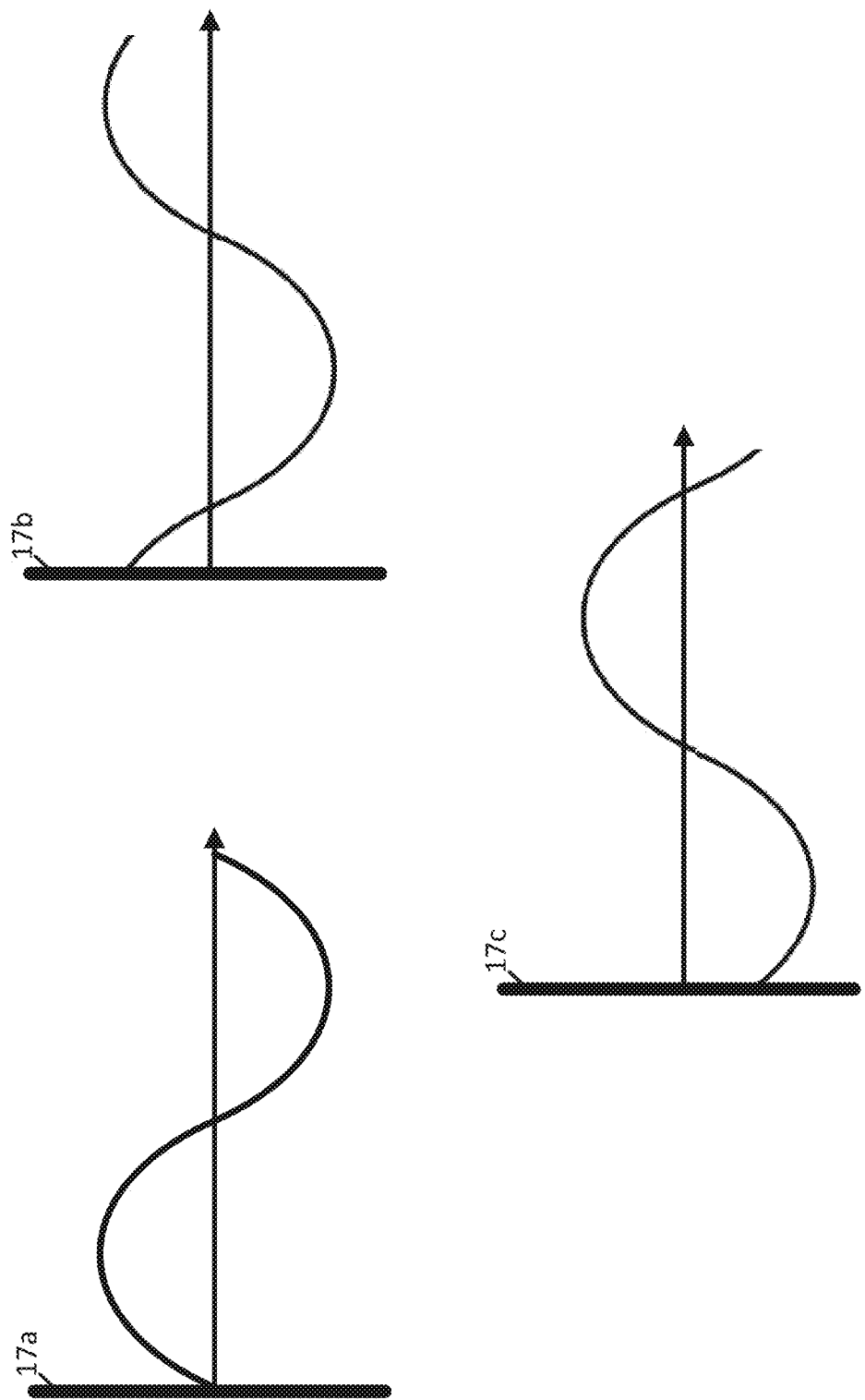
FIG. 4 illustrates another example set of templates for measurement of generator waveforms.

FIG. 4 illustrates another example set of templates for measurement of generator waveforms. In one example, the controller 100 may perform only a single iteration of template comparisons. The controller 100 may compare the measured generator waveform to the templates to estimate the phase angle. For example, the controller 100 may identify whether the measured generator waveform is associated with or closest to one of three phases. For example, a generator system may output three phases (e.g., phase A, phase B, phase C) that are approximately 120 degrees apart. Each of the templates may correspond to one of the phases (e.g., template 17a corresponds to phase A, template 17b corresponds to phase B, and template 17c correspond to phase C).

Using the example calculations above, the controller 100 may calculate a difference array based on the measured generator waveform and each of template 17a, template 17b, and template 17c. The controller 100 may compare the differences and select the template, and corresponding phase, with the smallest difference from the measured waveform. The controller 100 designates the phase of the measured waveform, for example, as phase A.

In response to the determined phase angle, the controller 100 may generate a phase display indicative of the determined phase angle. The phase display may instruct a user to connect the measured generator output to phase A of a bus, a load, or another generator. In response to the determined phase angle, the controller 100 may generate a breaker command to cause a breaker associated with the measured generator output to close a connection to phase A. For example, the command may be a generator paralleling command that instructs one or more generators in the generator system to become paralleled with each other. One of the generators may be instructed to start based on the generator paralleling command, or in the alternative, one or more running generators may be instructed to operate at a specific speed (e.g., increase or decrease a current speed based on a speed bias command), operate at a specific voltage (e.g., increase or decrease a current voltage based on voltage bias command), or a breaker control signal for tripping or closing a breaker to connect the generator to the bus.

Figure 5:
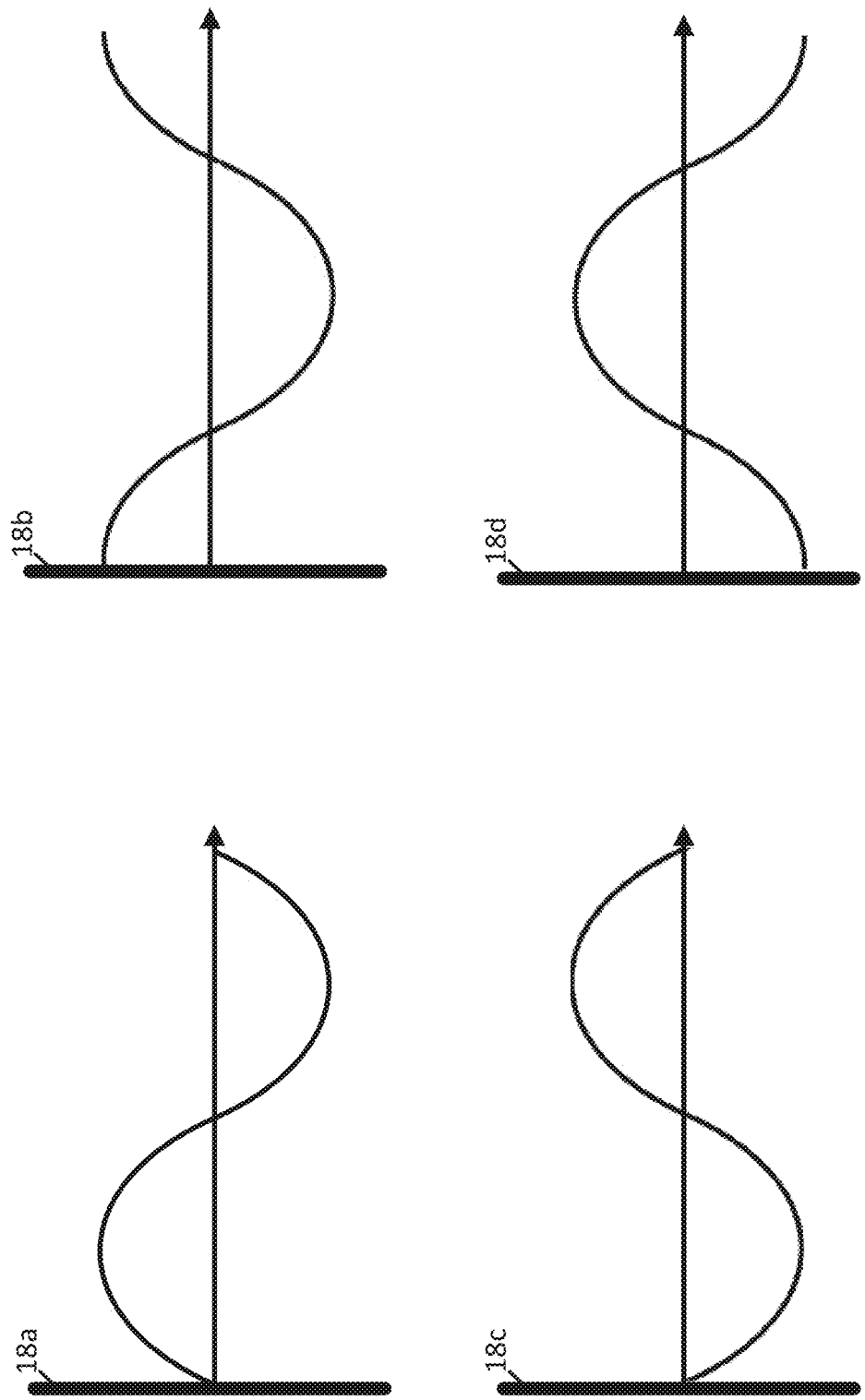
FIG. 5 illustrates another example set of templates for measurement of generator waveforms.

FIG. 5 illustrates another example set of templates for measurement of generator waveforms. The controller 100 may perform multiple iterations in the template comparison. Templates 18a, 18b, 18c, and 18d, illustrate an example including four templates for the first iteration of template comparison. Template 18a may correspond to a phase offset of 0 degrees, template 18b may correspond to a phase offset of 90 degrees, template 18c may correspond to a phase offset of 180 degrees, and template 18a may correspond to a phase offset of 270 degrees.

Consider an example in which the measured generator waveform has an offset of 120 degrees. The controller 100 compares templates 18a, 18b, 18c, and 18d to the measured generator waveform. Pairwise differences between each of the templates and the measured generator waveform are calculated. The sum of each of the differences is compared among the templates to identify the template that is closest to the measured generator waveform. The controller 100 chooses templates for the second itineration based on the closest sum of differences.

In the example of a measured waveform at 120 degrees offset, the second set of templates is between template 18*b* at 90 degrees offset and template 18*c* at 180 degrees offset. The second set of templates may include a template at 135 degrees offset and the template 18*b* at 90 degrees. In the second iteration, pairwise differences between the second set of templates and the measured generator waveform are calculated. The sum of each of the differences is compared among the templates to identify the template that is closest to the measured generator waveform. If the process ends at two iterations, the controller 100 selects the closest template as the estimated phase angle. If the iterations continue in the excess of two, the controller 100 chooses templates for the third itineration based on the closest sum of differences.

In the example of a measured waveform at 120 degrees offset, the closest template in the second iteration is the template at 135 degrees offset. The controller 100 selects the third iteration based on the 135 degrees offset. For example, the controller 100 selects a template midway between the second set of templates at 112.5 degrees offset. In the third iteration, pairwise differences between the third set of templates and the measured generator waveform are calculated. The sum of each of the differences is compared among the templates to identify the template that is closest to the measured generator waveform. If the process ends at three iterations, the controller 100 selects the closest template as the estimated phase angle. If the iterations continue in the excess of three, the controller 100 chooses templates for the fourth itineration based on the closest sum of differences.

In the example of a measured waveform at 120 degrees offset, the closest template in the third iteration is the template at 112.5 degrees offset. The controller 100 selects the fourth iteration based on the 112.5 degrees offset. For example, the controller 100 selects a template midway between the third set of templates at 123.75 degrees offset. If the process ends at fourth iterations, the controller 100 selects the closest template as the estimated phase angle. If the iterations continue in the excess of four, the controller 100 chooses templates for the fifth itineration based on the closest sum of differences. The process may have any number of iterations.

The templates may be pre-calculated and stored in memory, generated during a startup sequence, generated when required, or generated at another time. They may be generated as arrays of samples, or each sample may be generated in turn without storage of other samples. The templates may be generated or stored in hardware or software, the subtraction between templates may be performed in hardware or software.

Figure 6:
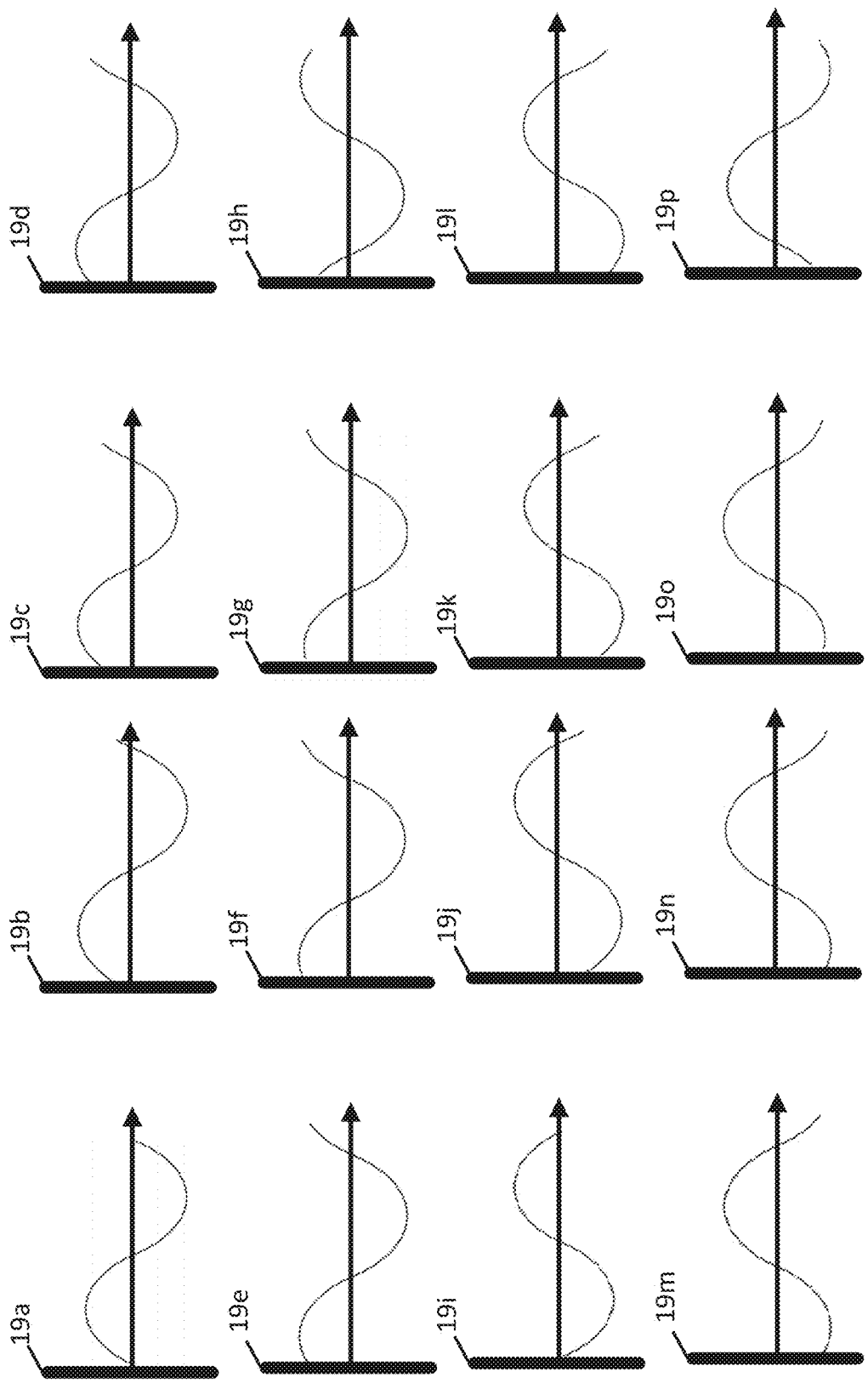
FIG. 6 illustrates another example set of templates for measurement of generator waveforms.

FIG. 6 illustrates another example set of templates 19*a-p* for measurement of generator waveforms. In one example, there may be more than four initial template, such as sixteen initial templates 19*a-p* may include successive offset phase angles of 22.5 degrees, 45 degrees, 67.5 degrees, 90 degrees, 112.5 degrees, 135 degrees, 157.5 degrees, 180 degrees, 202.5 degrees, 225 degrees, 247.5 degrees, 270 degrees, 292.5 degrees, 315 degrees, 337.5 degrees, and 360 degrees (0 degrees). Between each of the sixteen initial templates 19*a-p*, a second set of templates may include a template midway between successive templates that is paired with one of the sixteen initial templates to form the second set of templates for the second iteration.

In other words, the second set of templates may include fewer templates (e.g., a lesser quantity or a low quantity) than the first set of templates (e.g., higher quantity or high quantity). The example of FIG. 6 includes sixteen templates for the first set of templates and two templates for the second set of templates.

The higher quantity of templates for the first set of templates (first iteration) may be selected as an efficient application of computing resources. The first set of templates is applied to all possible measured waveforms. In other words, regardless of the phase offset of the measured waveform the first step in the process is to apply the first set of templates. Subsequent sets of templates are only used when the measured waveform happens to fall within the particular range for those templates. Therefore, less of an advantage would be achieved in including more templates in the second set of templates. In other words, when 16 templates are used in the first set of templates, those templates are used for each measured waveform, but any given template in the second set of templates is only used for $\frac{1}{16}$ of the measured waveforms, assuming an even distribution of phase offsets for the measured waveforms.

Figure 7:
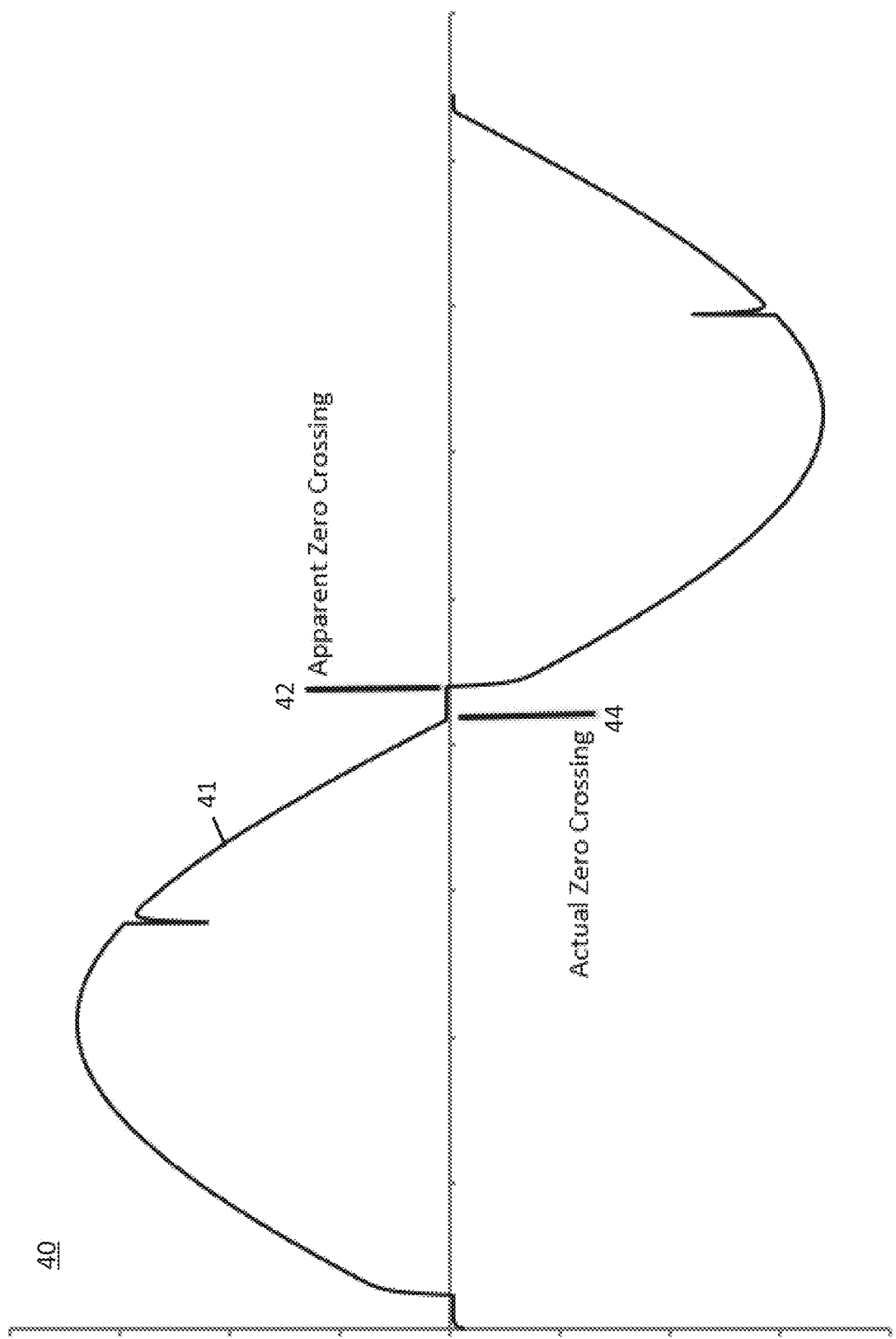
FIG. 7 illustrates an example measured generator waveform.

FIG. 7 illustrates an example measured generator waveform 41 that illustrates advantages of the iterative template matching process described herein. The output of a generator, while modeled by a sine wave, is different than a mathematically ideal sine waveform. Noise causes the output of the generator to fluctuate from the mathematically ideal sine waveform. In addition, a thyristor or other switch that that permits a large current to flow in a non-linear manner, resulting in asymmetry on the generator waveform due to sub-cycle current changes. A thyristor or SCR may cause the output voltage to drop close to zero or even below zero when first conducting due to a resistance to change output current by the inductance in the stator of the alternator 15. In addition, the thyristor may continue to allow current to flow due to the inductance of the stator after the produced voltage of the alternator 15 has crossed zero, causing flat portions of the waveform near the typical zero crossings.

Using one analysis, the measured generator waveform is analyzed based on zero crossings. The occurrence of a zero crossing in the measured generator waveform detected at a first time and compared to a zero crossing of an ideal sinusoidal waveform at a second time. The time period for a cycle is calculated based on the measured waveform. The difference between the first time and the second time is divided by the time for the period or cycle, and optionally, multiplied by 360 degrees, to calculate the phase angle between the measured generator waveform and the ideal waveform. While this technique may provide accurate results in many cases, noise or other phenomena may cause the zero crossings of the measured generator waveform to occur at irregular times, the calculation of the cycle or the time between waveforms is affected, resulting in an incorrect calculation of the phase angle.

One technique designed to overcome the miscalculation of the phase angle involves a Fourier transform or fast Fourier transform (FFT) of the two signals. An example may include 200 milliseconds (ms) (12 cycles at 60 hertz) of data from the measured waveform, which is subjected to a complex matrix analysis converting it to the frequency domain. The FFT of the data includes frequency components Derived from the magnitude of the complex components in a resultant matrix after the conversion to the frequency domain.

Each component, including the fundamental, is computed as a complex number, allowing depiction as an amplitude and phase. The phase of each fundamental waveform may be obtained from the resultant matrix, providing a phase angle relative to a virtual reference signal. Phase angles obtained from taking the Fourier transform of the signal can be subtracted to remove the virtual reference signal from consideration and to provide a phase between the signals. However, the indicated phase angle in this case is effectively the phase angle between the average phase of the two signals, which may be significantly different than the actual phase angle between the signals at the time of computation, even if the computation is performed in a period of time that is relatively short when compared to a cycle of the alternator waveform.

However, the difference between the waveform is effectively the difference in the average over the time period under analysis. For example, when the sample period provided to the Fourier transform or FFT is 200 ms, the average phase angle is closest to the phase angle between the signals at the center of the sample window, or 100 ms prior to the signal measurement.

While the multiple-cycle Fourier transform or FFT may provide a very accurate phase angle between signals of identical frequency (where the phase angle between the signals does not change), the measured phase angle is delayed relative to the actual phase between the signals at the time of calculation. Although it is possible to establish a signal phase angle using an FFT over a single cycle, the required sample rate for this calculation and corresponding number of calculations required may necessitate special, dedicated hardware, such as an FPGA or ASIC.

The calculations required for a Fourier Transform or FFT increase linearly as the sample window size decreases in time due to a need for a given data set sample quantity to achieve a given accuracy. In order to decrease the sample window size in time while retaining a similar number of samples to the algorithm, the sample rate is increased. In addition, the calculation still requires the same number of operations, so increasing the frequency of the calculation will necessarily result in a linear increase in the number of instructions that must be executed per second in a processor, FPGA or ASIC.

The calculations required for a Fourier Transform or FFT increase linearly as the sample window size decreases in time due to a need for a given data set sample quantity to achieve a given accuracy. In order to decrease the sample window size in time while retaining a similar number of samples to the algorithm, the sample rate must be increased. In addition, the calculation still requires the same number of operations, so increasing the frequency of the calculation will necessarily result in a linear increase in the number of instructions that must be executed per second in a processor, FPGA or ASIC.

If the sample rate is increase to establish 10,000 samples in a single cycle of a 60 Hz waveform (600,000 samples/second), the calculation will still require 4,000,000 instructions, but is run 60 times per second, requiring 240,000,000 instructions per second of the processor for a single waveform calculation.

As a comparison, the template matching technique can maintain a similar or identical sample rate while decreasing the sample window in time, meaning that the number of elements in the templates will decrease. While the calculation is performed more frequently, the required operations to execute the process will decrease.

For example, at a sample rate of 6,000 samples per second, a single cycle template will contain 100 samples from a 60 Hz waveform. If the calculation is iterated 15 times, the template subtraction may be calculated 16 times, resulting in 1600 subtractions in the processor, plus the lookup time for the template. This may require as little as 60*1600 or 96,000 instructions in the processor per second.

If the calculation is performed 10 times per cycle, the template size is only 10 cycles long, so even though it is computed 600 times per second, the template subtraction only requires 10 subtractions, so the total subtractions may be as low as 600* 160=96,000. This means that the only increase in loading from an increase in sample rate may be related to the processor cycles required to look up the appropriate template.

Figure 8:
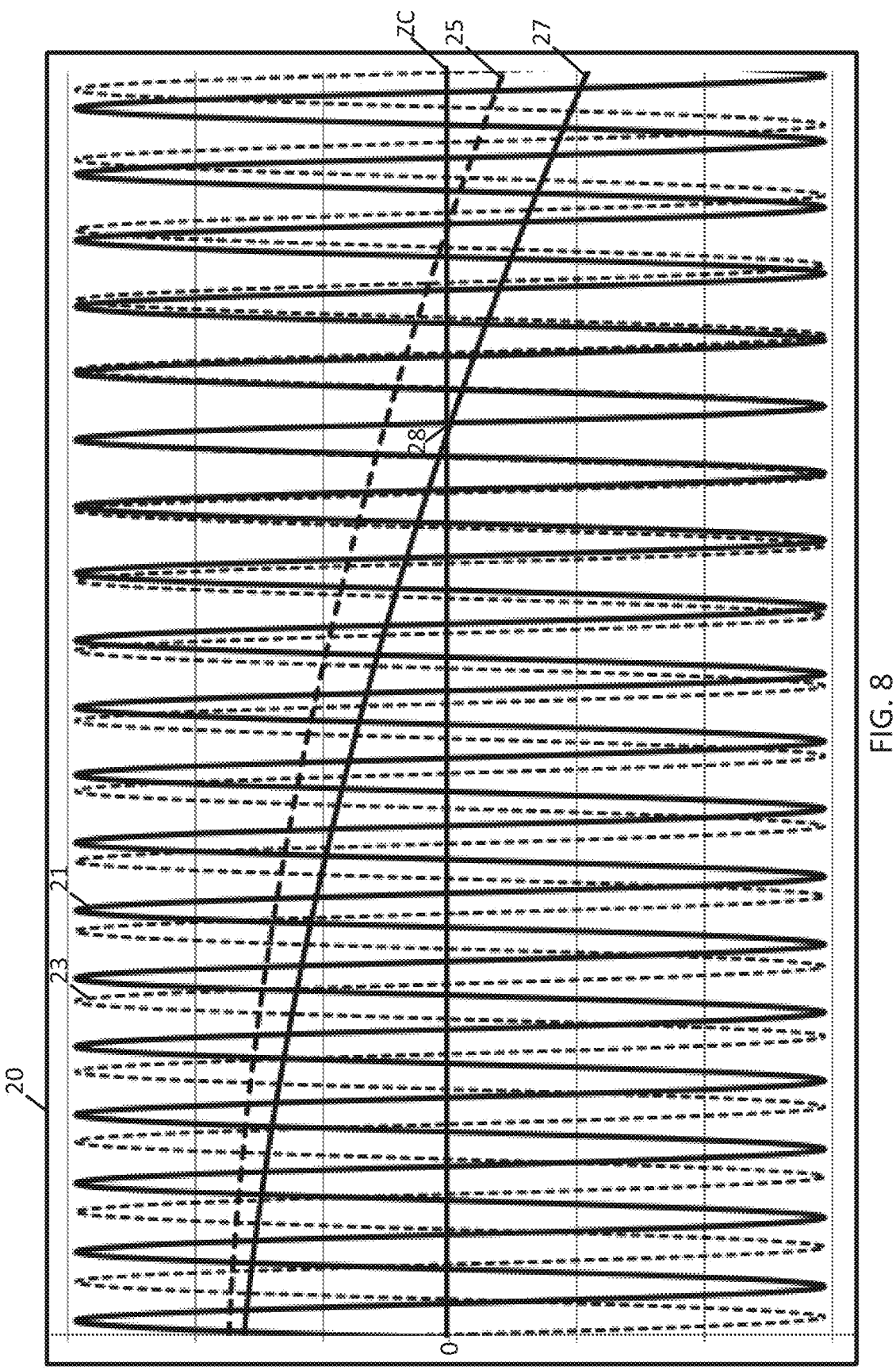
FIG. 8 illustrates a comparison of phase angle calculations using templates to the phase calculations using a finite transform.

FIG. 8 illustrates a comparison of phase angle calculations using templates to the phase calculations using a finite transform (e.g., Fourier transform). The graph 20 includes a comparison of an "incoming" waveform 21 in solid line and a "running" waveform 23 in a dotted line such that the running and incoming frequencies are different causing the phase angle between them to vary with time. By visually comparing the solid line and the dotted line, the phase offset between the waveforms may be estimated. When the solid line and the dotted lines overlap, the phase offset approaches zero. The graph 20 also includes a first phase angle calculation 25 using a standard FFT calculation and a second phase angle calculation 27 using the template matching technique.

For the example, the first phase angle calculation 25 based on the FFT requires 12 cycles at 60 Hz, 10 cycles at 50 Hz (a 200 ms period). The result of the first phase angle calculation 25 experiences an observed delay of half the total period time (100 ms or 6 cycles of a 60 Hz waveform). Graph 20 illustrates that the first phase angle calculation 25 reports a phase angle much higher than zero when the two waveforms are in synchronism at the synchronism point 28. The level at the synchronized point 28 corresponds to the phase angle average over the last 12 cycles, but most closely resembles the actual phase angle 100 ms in the past.

Using the first phase angle calculation 25, the result is always delayed by at least this theoretical minimum. Graph 20 illustrates that the first phase angle calculation 25 is much higher at the actual zero crossing (ZC) than zero. The level at ZC corresponds to an average of the earlier six cycles.

The second phase angle calculation 27, on the other hand, using the real time FFT or template matching technique, is instantaneous or substantially instantaneous. Graph 20 illustrates that the second phase angle calculation 27 is at or near zero when the comparison shows that waveforms 21 and 23 substantially overlap at synchronous point 28.

Figure 9:
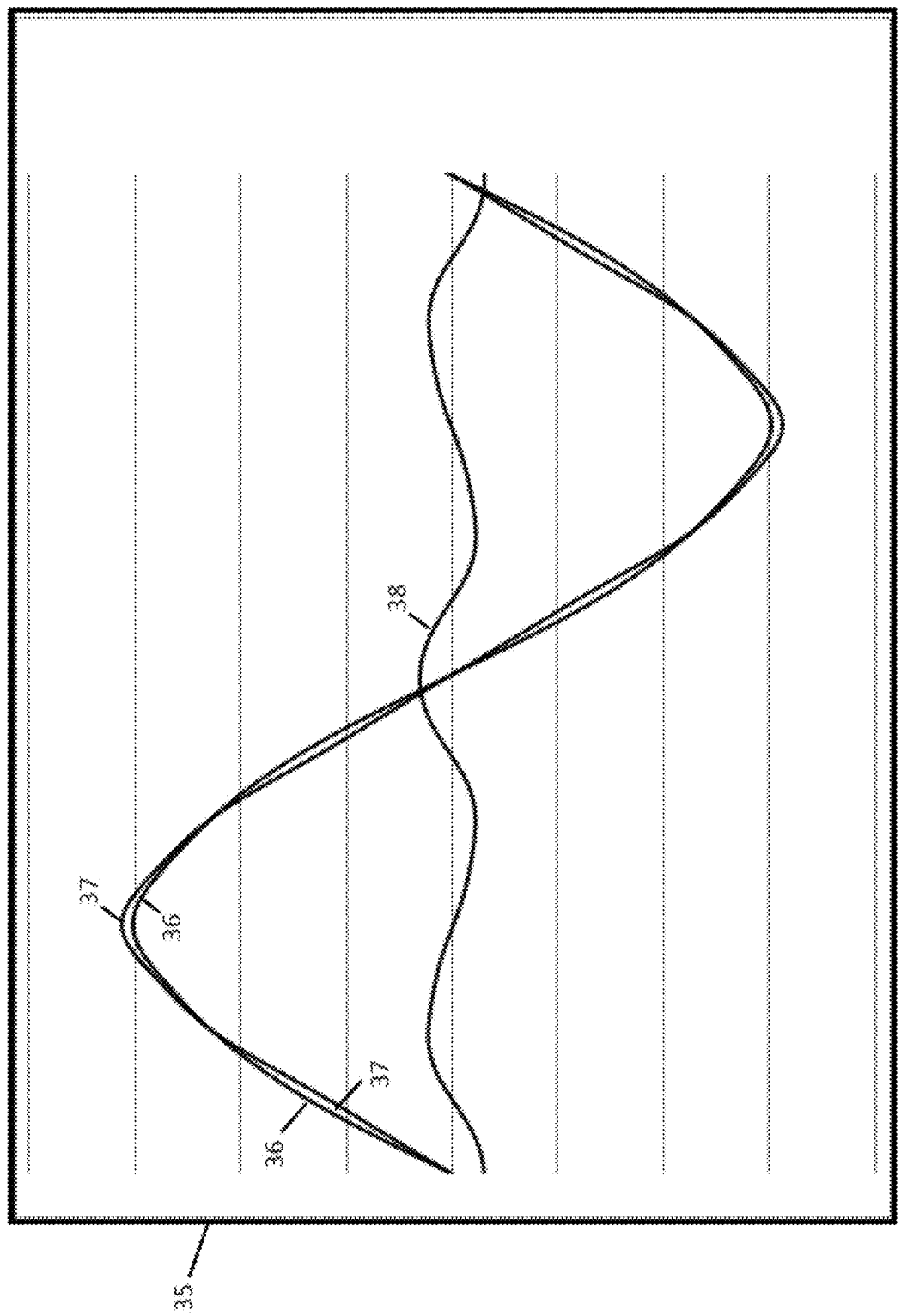
FIG. 9 illustrates output signals for alternators having different pitches.

FIG. 9 illustrates output signals for alternators having different pitches and the current that flows between them if paralleled. The techniques for template matching may also accurately measure phase angle for a generator waveform when two or more generators having a different pitch are paralleled together. The term pitch may refer to the percentage that each pole of the alternator is filled with winding. The pitch describes how much available magnetic area is enclosed by the coils. The pitch seldom reaches unity on an alternator designed to produce AC for distribution due to physical constraints and total harmonic distortion (THD) requirements. Examples of alternator pitches include 5/6 pitch or 2/3 pitch. Higher fractions for the alternator pitch are associated with more power from a given amount of iron and copper, but at the cost of higher harmonic content and therefore higher THD.

In FIG. 9 graph 35 includes a high pitch waveform 37 (e.g., a 5/6 output pitch) and a low pitch waveform 36 (e.g., a 2/3 output pitch). A harmonic current waveform 38 illustrates harmonics caused by the current with the high pitch alternator and the low pitch alternator are paralleled. The output voltages of two generators of different pitches are different shapes, and when paralleled together, the output voltage of the paralleled system is an average of the output voltages of the two generators.

When two generators of different pitches are paralleled, one or more harmonic currents may flow between the generators (e.g., third order harmonic, fifth order harmonic, and so on). In one example, two generators (generator 1 and generator 2) are electrically coupled in parallel or paralleled. The two generators may produce one or more harmonics and different voltage levels, resulting in currents associated with those harmonics flowing between the paralleled generators.

In one example, generator 1 may produce a high output (e.g., 120 volts) on the fundamental or first order harmonic, approximately no output or zero volts (e.g., 0.1 volts) on a higher harmonic (e.g., third order harmonic), and approximately a medium output (e.g., 5 volts) on a highest significant harmonic (e.g., fifth order harmonic). Conversely, generator 2 may produce a high output (e.g., 120 volts) on the fundamental or first order harmonic, approximately a medium output (e.g., 6 volts) on a higher harmonic (e.g., third order harmonic), and approximately no output or zero volts (e.g., 0.1 volts) on a highest significant harmonic (e.g., fifth order harmonic).

In operation, generator 2 provides a short to generator 1 on the fifth order harmonic and generator 1 provides a short to generator 2 on the third order harmonic. Generator 1 operates as a short circuit on the third order harmonic, and generator 2 operates as a short circuit on the fifth order harmonic. As a result, there is a current with a frequency of approximately 180 hertz that flows between the two generators and a current with a frequency of approximately 300 hertz that flows between the two generators.

The third order and fifth order harmonics may disrupt the detection of the phase angle of the fundamental harmonic. When the current of the fundamental harmonic is low, the current flowing between the generators for the third and fifth harmonics may be detected instead, and specifically, zero crossings of the third and fifth harmonics may be detected. When calculating the phase angle based on zero crossings, the phase angle may be incorrectly calculated based on the zero crossings of the third and fifth harmonics, resulting an incorrect estimation of phase angle. With multiple zero crossings, the current may appear to be both leading and lagging the voltage. For example, comparing the zero crossings of the current waveform 38 in graph 35 the zero crossings of the voltage waveforms 36 and 37, the current 38 includes zero crossings that both lead and lag the voltage waveforms 36 and 37.

The template matching techniques described herein do not rely on the accuracy of a zero crossing detection. Therefore, the template matching techniques overcome the problems caused by zero crossings in the third and fifth order harmonics because the fundamental phase angle may be detected even when higher-order harmonic currents have significantly higher amplitude due to the comparison to a fundamental waveform.

Advantages of the template matching techniques described herein include reaction of requisite time, reduction in effect of noise, reduction in effect of total harmonic distortion (THD), flexibility is sample size, flexibility in sample selection, decreased processor loading and other advantages.

In the zero crossing techniques, at least a full period or cycle of the measured waveform is required. The phase angle is calculated based on the time period of the cycle that is calculated from detecting the duration of the cycle of the measured waveform. Thus, the reaction time of the zero crossing techniques cannot be less than one cycle of the measured waveform. In the template matching techniques, the reaction time is reduced drastically because much less of the generator waveform is needed. In some examples template matching is performed using half of a cycle of the measured waveform. In other examples a smaller fraction of the cycle of the measured waveform may provide adequate data for comparison with the templates. Examples of the smaller fraction may be $\frac{1}{10}$, $\frac{1}{20}$ or $\frac{1}{30}$ of the cycle of the measured waveform. The template matching also is flexible in sample size. Different sample sizes may be used in different scenarios.

The template matching techniques may be used to establish fundamental frequency, fundamental voltage, fundamental phase angle, or any combination of the three. The template matching techniques may also be used to compute harmonic amplitudes and phases.

The template matching techniques are also flexible in sample selection. That is different sections of the generator waveform may be used. The sample selection need not include a zero crossing of the measured waveform. The section of the sample may be selected randomly in time. The section of the sample may vary according to the difference between the measured waveform and the closest template. When the difference between each of the templates and the measured waveform exceeds a threshold, the controller 100 may adjust the sample selection or make another sample selection. In some examples, the portion of the cycle sampled for the template matching may be selected based on waveform peaks, inflection points, zero crossings, maximum slopes, minimum slopes, zero slopes, irregularities, or at a fixed interval regardless of input waveform characteristics.

The template matching techniques may reduce the effects of noise. Noise on the measured waveform may cause the measured waveform to flip flop above and below zero near a zero crossing. When the zero crossing is relied upon for determining the phase offset, the noise disrupts the calculation. However, in the template matching techniques described herein, no zero crossing is used, which minimizes the effects of noise. Similarly, THD also impacts the phase offset calculations in zero crossing calculations and can be minimized by template matching.

In another example, the template matching techniques are used to measure THD. The controller 100 may estimate THD based on the difference between the measured generator waveform and the fundamental amplitude as established by the closest template. Consider the example of multiple iterations of template matching. The controller 100 may designate a specific iteration (e.g., $3^{rd}$ iteration) as finely tuned enough to approximate the measured waveform. Note that the $3^{rd}$ iteration may be a resolution of about 0.2% (10%/16/2/2=0.156%) when the first iteration includes sixteen template divisions, the second iteration includes two template divisions, and the third iteration includes two template divisions. When the difference between the measured generator waveform and the closest template in the third iteration varies over time and multiple instances of template matching, the closest template may be different for each test. The resultant amplitude determined by the template matching technique corresponds to the fundamental amplitude of the waveform, which can be compared to the measured RMS amplitude to determine THD.

The controller 100 may also determine the sample size for template matching based on the THD estimate. For example, when the THD estimate is more than a threshold, the sample size is increased, and when the THD estimate is less than the threshold, the sample size is decreased. The sample size may be increased or decreased by increasing or decreasing the sample interval between samples or by increasing or decreasing the time span for taking samples.

Figure 10:
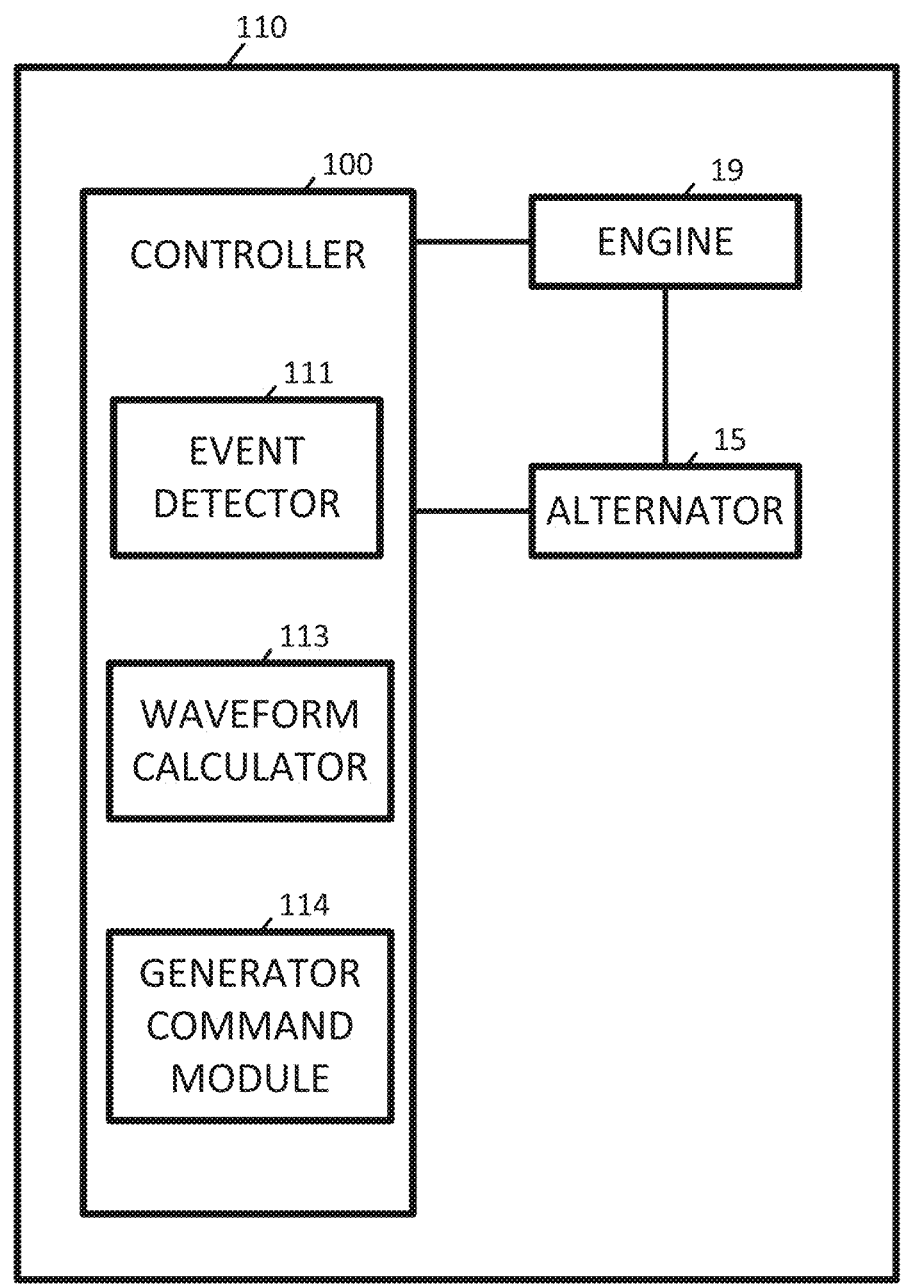
FIG. 10 illustrates another example generator.

FIG. 10 illustrates an example generator 110. The generator 110 may include an alternator 15, an engine 19, and a controller 100 as described above. The controller 100 may include an event detector 111, a waveform calculator 113, and a generator command module 114. The event detector 111 may include hardware or circuitry for measuring events in waveforms defined by curvature changes or zero crossing. The waveform calculator 113 may for measuring electrical parameters of waveforms such as amplitudes, frequencies, and/or phase offsets. The generator command module 114 may include hardware or circuitry for generating generator commands. The command module circuitry may be a digital or analog circuit that receives an input of the selected measured waveform from the waveform calculator 113 and outputs a command for the generator system. The controller 100 of FIG. 9 may be combined with the featured described above and specifically with the features of FIG. 2. For example, the event detector 111 and waveform calculator 113 may be combined with the template module 11 and the template comparator 13. Additional different or fewer components may be included.

The controller 100 is configured to calculate a statistical parameter for a measured generator waveform. The generator waveform may be the output of alternator 15 and may include a single phase waveform or a multiple phase waveform. The statistical parameter may be a root mean square (RMS) value. The RMS value is the square root of the sum of the mean of squares of a set of samples spanning a period or a cycle of the generator waveform. The RMS value may be estimated using less than a full cycle of the generator waveform. In some examples, the RMS value is based on less than ½ of the period of the waveform. One twelfth of the period of a three phase waveform may be used to calculate the RMS value.

The controller 100 identifies at least one generator waveform. The generator waveform may include an array of numbers that describe an electrical value of an output of the generator. The generator waveform may be monitored using a sensor such as a voltage sensing circuit or a current sensing circuit. The array of numbers may be samples that are collected by a sampling circuit. The at least one generator waveform may include a single phase or multiple phases. The at least one generator waveform may be measured from line level outputs to neutral or from line to line (e.g., from one phase to another phase).

The event detector 111 of the controller 100 detects a first event of the at least one generator waveform. The first event may be a critical point of the generator waveform (e.g., an algebraic critical point of the algebraic function that approximates the generator waveform). The first event or the critical point may be a zero crossing of the waveform, a local maximum of the waveform, a local minimum of the waveform, or an inflection point of the waveform. A zero crossing is a point along the generator waveform where the generator waveform cross zero (e.g., the x-axis) such that points preceding the point are all negative and points subsequent to the point are all positive, or vice versa.

A local minimum is a point along the generator waveform such that point preceding in time and subsequent in time are greater than the point. A local maximum is a point along the generator waveform such that points preceding in time and subsequent in time are less than the point. The local maxima or minimum may be identified as zero crossings of a first derivative of the algebraic function of the generator waveform. An inflection point is a point along the generator waveform such that points preceding in time have a positive curvature and point subsequent in time have a negative curvature or points preceding in time have a negative curvature and point subsequent in time have a positive curvature. The inflection point may be identified as a zero crossing of a second derivative of the algebraic function of the generator waveform.

The controller 100 identifies a second event of the at least one generator waveform. The second event may be a critical point of the generator waveform. The second event may be a zero crossing of the waveform, a local maximum of the waveform, a local minimum of the waveform, or an inflection point of the waveform.

The first event and the second event may be critical points in the same signal or critical points in different phases of the generator waveform. Consider an example of a generator waveform having three phases (e.g., phase A, phase B, and phase C). The first event may be a critical point in one of the phases and the second event may be a critical point in another of the phases. For example, the first event may be a zero crossing in phase A and the second event may be an inflection point in phase B, the first event may be a local maximum in phase C and the second event may be a local minimum in phase A, or the first event may be a local maximum in phase B and the second event may be an inflection point in phase C. Other combinations are possible.

The controller 100 determines a time interval between the first event and the second event. The time interval spans less than a half cycle of the at least one generator waveform. In some examples the time interval is 1/12 of a cycle or smaller. Examples of time intervals include 5/12 of a cycle, 1/3 of a cycle, 1/4 of a cycle, 1/6 of a cycle and 1/12 of a cycle.

The waveform calculator 113 of the controller 100 calculates the representative root mean squared value for the at least one generator waveform based over the time interval. In calculating the RMS value, the controller 100 may combine portions of the generator waveforms from different phases in order to estimate the RMS value for the entire generator waveform. Alternatively, in calculating the RMS value, the controller 100 duplicates or extrapolates a portion of a single phase waveform over the time interval less than a half cycle of the generator waveform. A portion of the waveform using waveform symmetry, extrapolates a portion using a stored wave shape or waveform, compares the waveform to a template, or limits the sample window to a representative fraction of the entire cycle. This may be performed on single or three-phase waveforms.

Figure 11:
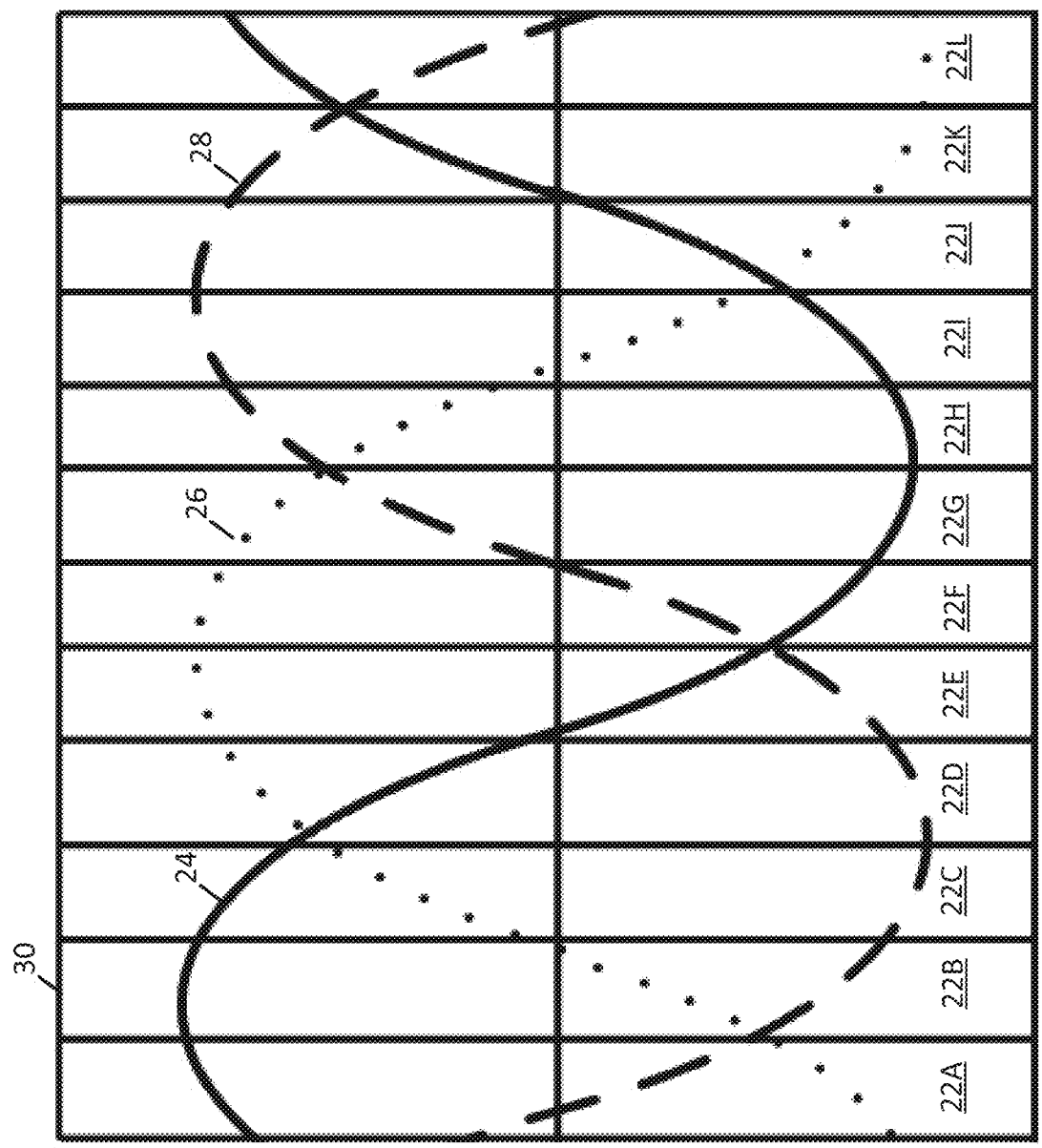
FIG. 11 illustrates a three phase sinusoidal signal.

FIG. 11 illustrates an example generator waveform 30 including three phases such as a first phase 24 (illustrated in a solid line), a second phase 26 (illustrated in a dotted line), and a third phase 28 (illustrated in a dashed line). The generator waveforms are divided into slices having a time interval equivalent to 1/12 of a period. The twelve slices 22A-L each represent a time interval that may be used to calculate an RMS value that represents the entire generator waveform 30.

Figure 12:
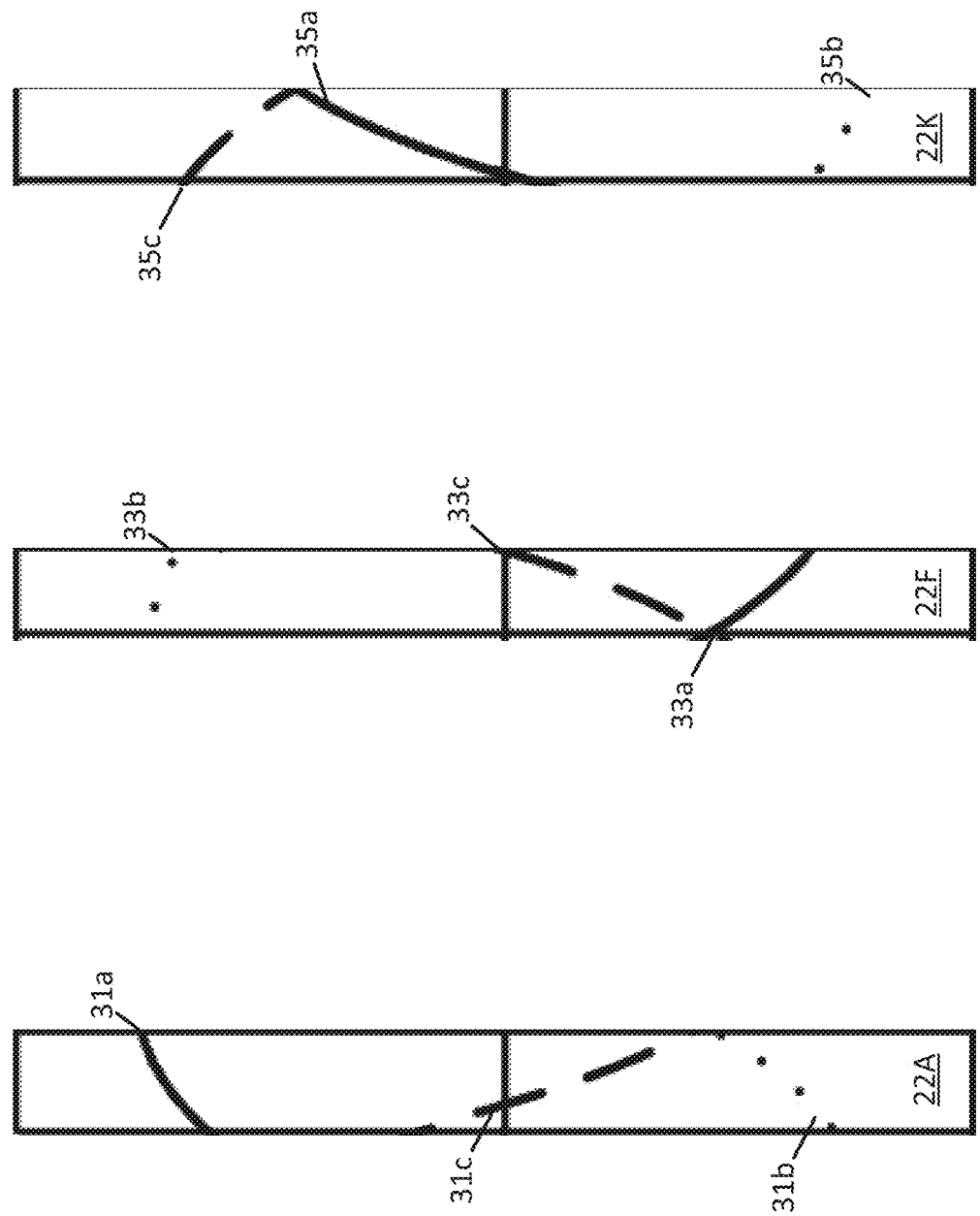
FIG. 12 illustrates time slices of the three phase sinusoidal signal of FIG. 11.

FIG. 12 illustrates three exemplary time slices (time slices 22A, 22F, 22K). Time slice 22A includes a first portion 31a corresponding to phase A of the generator waveform, a second portion 31b corresponding to phase B of the generator waveform, and a third portion 31c corresponding to phase C of the generator waveform.

The absolute values of the first portion 31a, the second portion 31b, and the third portion 31c correspond to one quarter of the cycle of the generator waveform. Consider an example of first phase 24 graph that extends between zero crossing near slices 22D through 22J. The absolute values in this half cycle include all of the values in the sine wave. That is, the absolute value of a since wave includes a repeating pattern at half of the original period. Thus, half of a cycle of a sine wave already includes all of the data necessary to describe the entire sine wave. Closer inspection reveals, that the half of the cycle is also symmetrical about a vertical line and includes two sets of data, where half of the data is sufficient to describe the sine wave. Thus, ¼ of a cycle of a sine wave includes enough data to uniquely describe the sign wave.

Similar principles may be applied to a multiple phase generator waveform, where each of the phases are substantially similar to one another. When two phases of a sine wave are in a time slice of ¼ of a cycle of the sine wave, each phase includes enough data to uniquely describe the sign wave. Only half of the data is needed. For a two phase signal, a time slice of ⅛ of the period of the sign wave is sufficient to describe the sign wave. When three phases of a sine wave are in the same slice of ¼ of a cycle of the sign wave, each phases also includes enough data to uniquely describe the sign wave. Only one third of the data is needed. For a three phase signal, a time slice of 1/12 of the period of the sign wave is sufficient to describe the sign wave.

The waveform calculator 113 of the controller 100 may include a detection circuit or sampling circuit for collecting measurements of the generator waveform. The measurements or samples may be for a single phase or multiple phases. In the instance of multiple phases, the waveform calculator 113 may include a sampling circuits for each of the phases, or a three phase sampling circuit, so that data is collected simultaneously or near simultaneously. Near simultaneously may be defined as within a timer period of one another and the time period may be in the range of 1 to 20 milliseconds The waveform calculator 113 of the controller 100 may aggregate the measurements from each of the phases of the generator waveform. That is, the waveform generator 113 may identify multiple measurements from a first phase of the generator waveform, multiple measurements from a second phase of the generator waveform, and multiple measurements from a third phase of the generator waveform. The waveform calculator 113 may square the measurements from each of the phases, sum the squares, and perform a square root operation on the sum of squares.

The measurements from the first phase, the measurements from the second phase, and the measurements from the third phase are collected during a predetermined time period. The time period may be a fractional portion of the cycle of the generator waveform. The time period may be greater than zero and less than one half of a cycle of the generator waveform. The time period may extend from a critical point of one phase of the generator waveform to a critical point of a second phase of the generator waveform. The time period may extend from a critical point of one phase of the generator waveform, past a critical point of a second phase of the generator waveform, and to a critical point of a third phase of the generator waveform.

The generator command module 114 analyzes the RMS value to generate a command for the generator system. The command may be an instruction to adjust a field current of the alternator 15. The command may be an instruction to close the generator to a bus when the amplitude of the measured waveform is within a predetermined range. The command may be a throttle instruction to adjust a throttle of the engine 15 when the measured waveform has a RMS value that is outside of a predetermined range.

Figure 13:
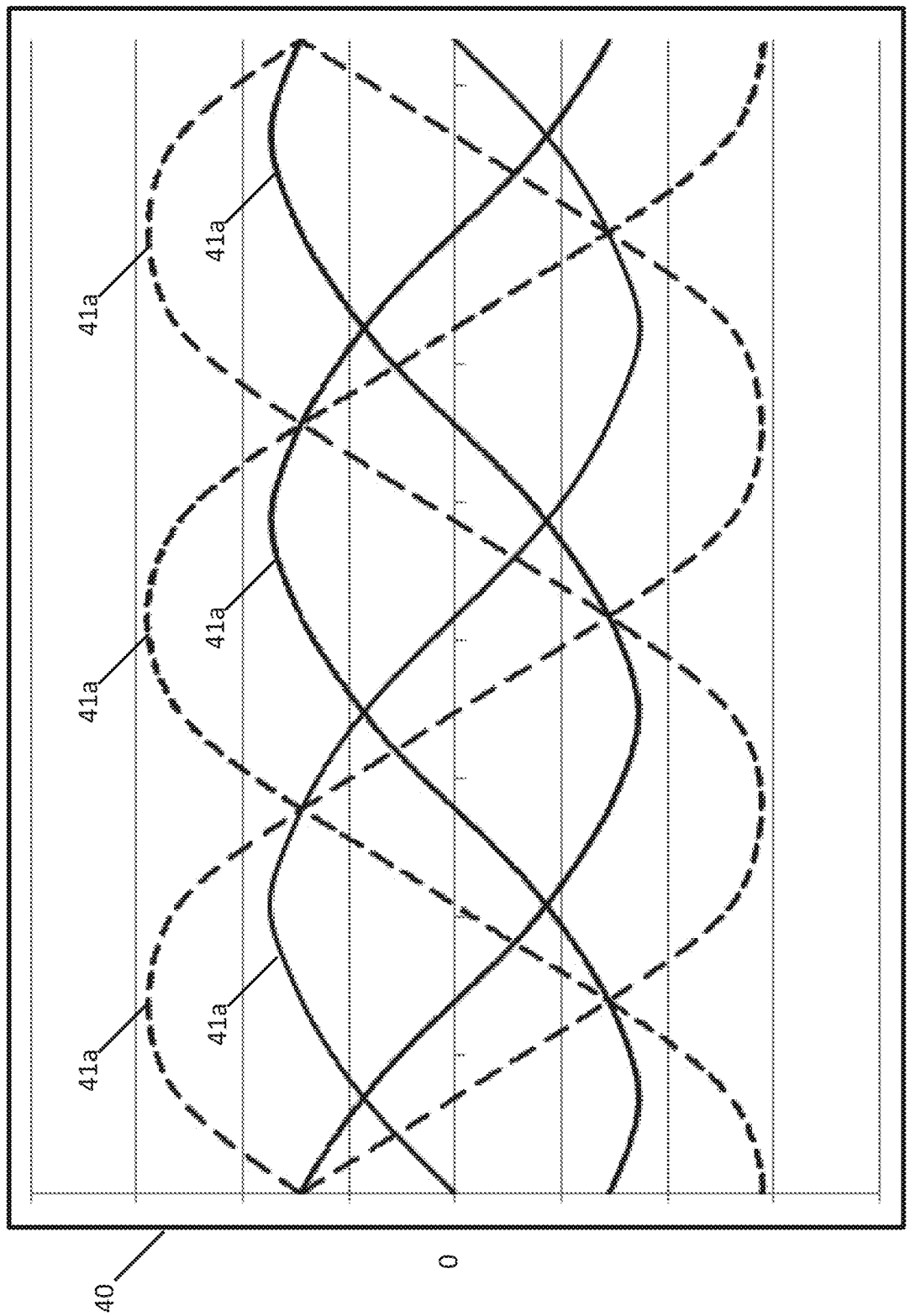
FIG. 13 illustrates line to line and line to neutral values for a three phase sinusoidal signal.

FIG. 13 illustrates line to line and line to neutral values for a three phase sinusoidal signal. Referring back to the slices 22A-L in FIG. 11, the division of slices may be derived from zero crossings that occur in either the line to line values or the line to neutral values. For examples, line to line voltage 43a crosses zero twice, line to line voltage 43b crosses zero twice, and line to line voltage 43c crosses zero twice. Similarly, line to neutral voltage 41a crosses zero twice, line to neutral voltage 41b crosses zero twice, and line to neutral voltage 41c crosses zero twice. The twelve zero crossings define the slices 22A-L.

Figure 14:
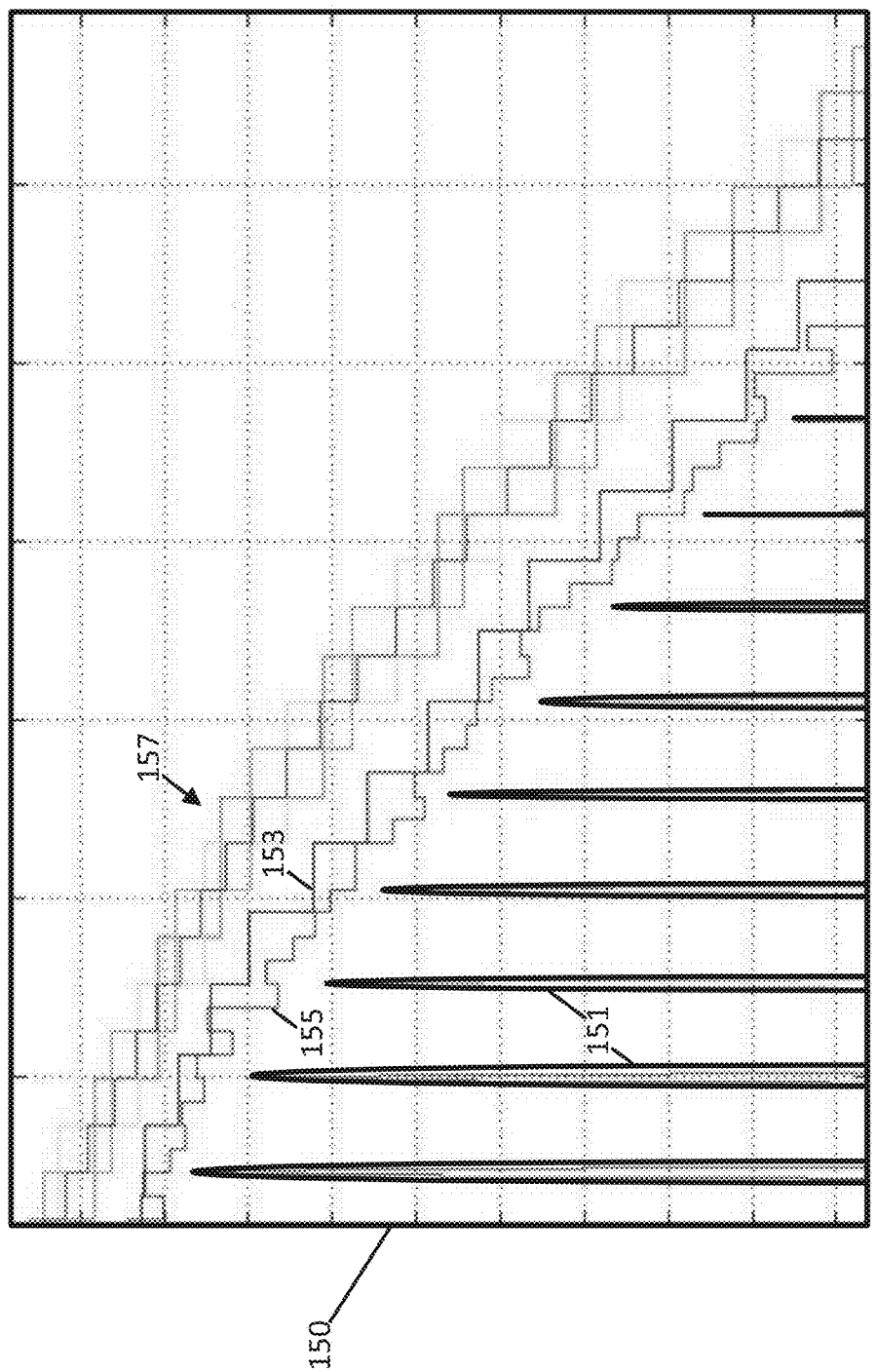
FIG. 14 illustrates an example plot of twelfth cycle RMS calculations and full cycle RMS calculations.
Figure 15:
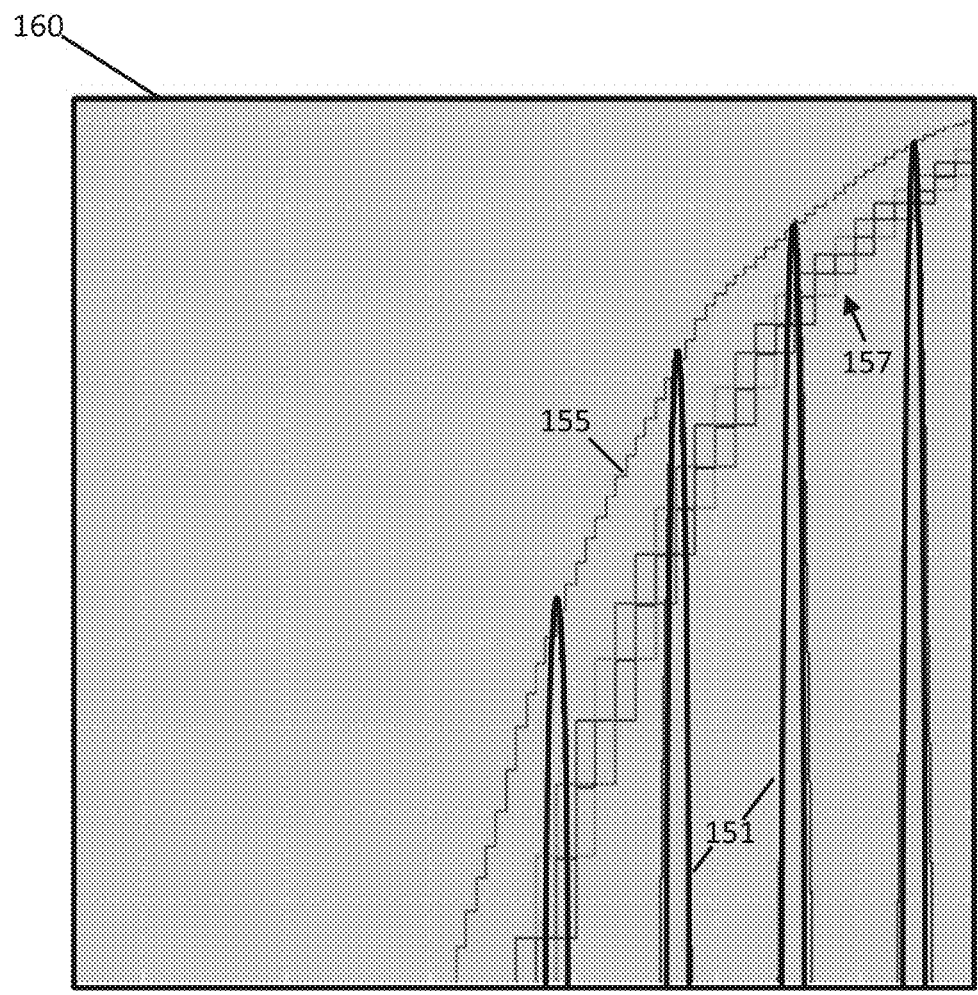
FIG. 15 illustrates another example plot of twelfth cycle RMS calculations and full cycle RMS calculations.

FIG. 14 illustrates an example plot 150 of twelfth cycle RMS calculations and full cycle RMS calculations. FIG. 15 illustrates another example plot of twelfth cycle RMS calculations and full cycle RMS calculations after a load is applied with the generator waveform recovering. The waveform 151 corresponds to the output of the generator. The square waves 157 correspond to RMS calculations from full cycle RMS calculations. The square waves 153 and 155 correspond to RMS calculations using the generator waveform measurements described herein. Square wave 153 corresponds to a single phase example or quarter cycle RMS calculations, and square wave 155 corresponds to a three phase example or twelfth cycle RMS calculations. Square wave 157, calculated over a whole cycle of the waveform 151. Square wave 153 is calculated over a quarter cycle of the waveform 151. Square wave 155 is calculated over a twelfth of a cycle of waveform 151.

Figure 16:
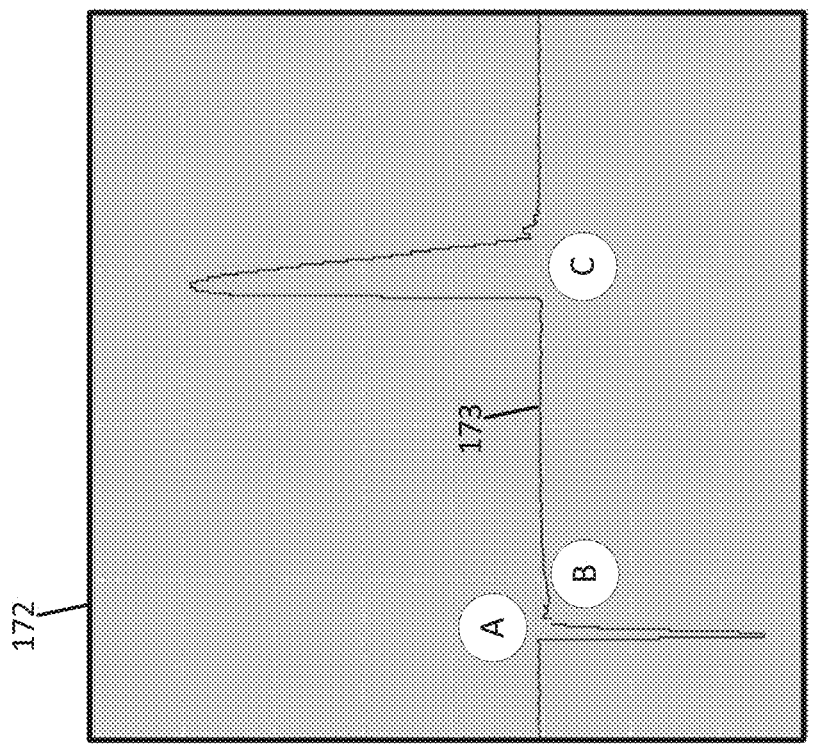
FIG. 16 illustrates example control system responses using twelfth cycle RMS calculations and full cycle RMS calculations.
Figure 16:
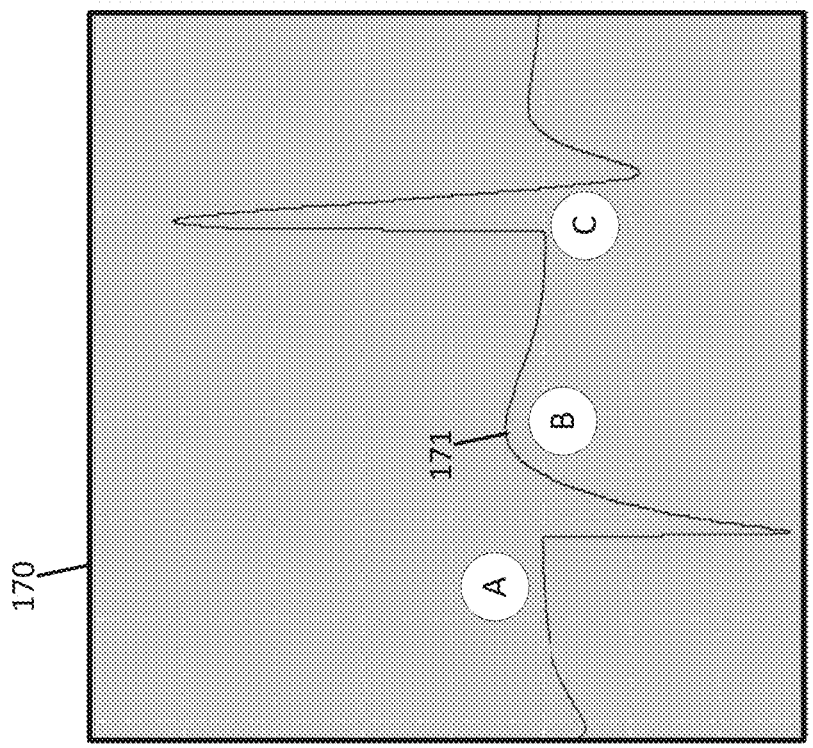

FIG. 16 illustrates example control system responses using twelfth cycle RMS calculations and full cycle RMS calculations. The delay in the feedback is reduced using the twelfth (or quarter) of a cycle RMS calculation. The minimization of the delay in the feedback is shown from the response of a control system. Plot 170 includes a response 171 of a control system from full cycle RMS calculations. Plot 172 includes a response 173 of a control system from twelfth (or quarter) RMS calculations.

Plots 170 and 172 are from control systems with the same gains; only the sensing techniques are changed. Plot 172 dips a lot less than plot 170, when load is applied such as at region A. Plot 172 recovers more stably with less overshoot when stabilizing after the load than plot 170, as shown by region B. Plot 172 does not overshoot as much as plot 170 when load is taken off as shown by region C.

Thus, the plot 172 for the twelfth or quarter cycle provides an increased response time that corresponds to less overshoot and quicker stabilization in response to load changes on the generator. The increased response time provides advantages such as improved user experience from lights dimming or flickering. The increased response time improves the stability of the control system, which may avoid oscillation for some loads.

Figure 17:
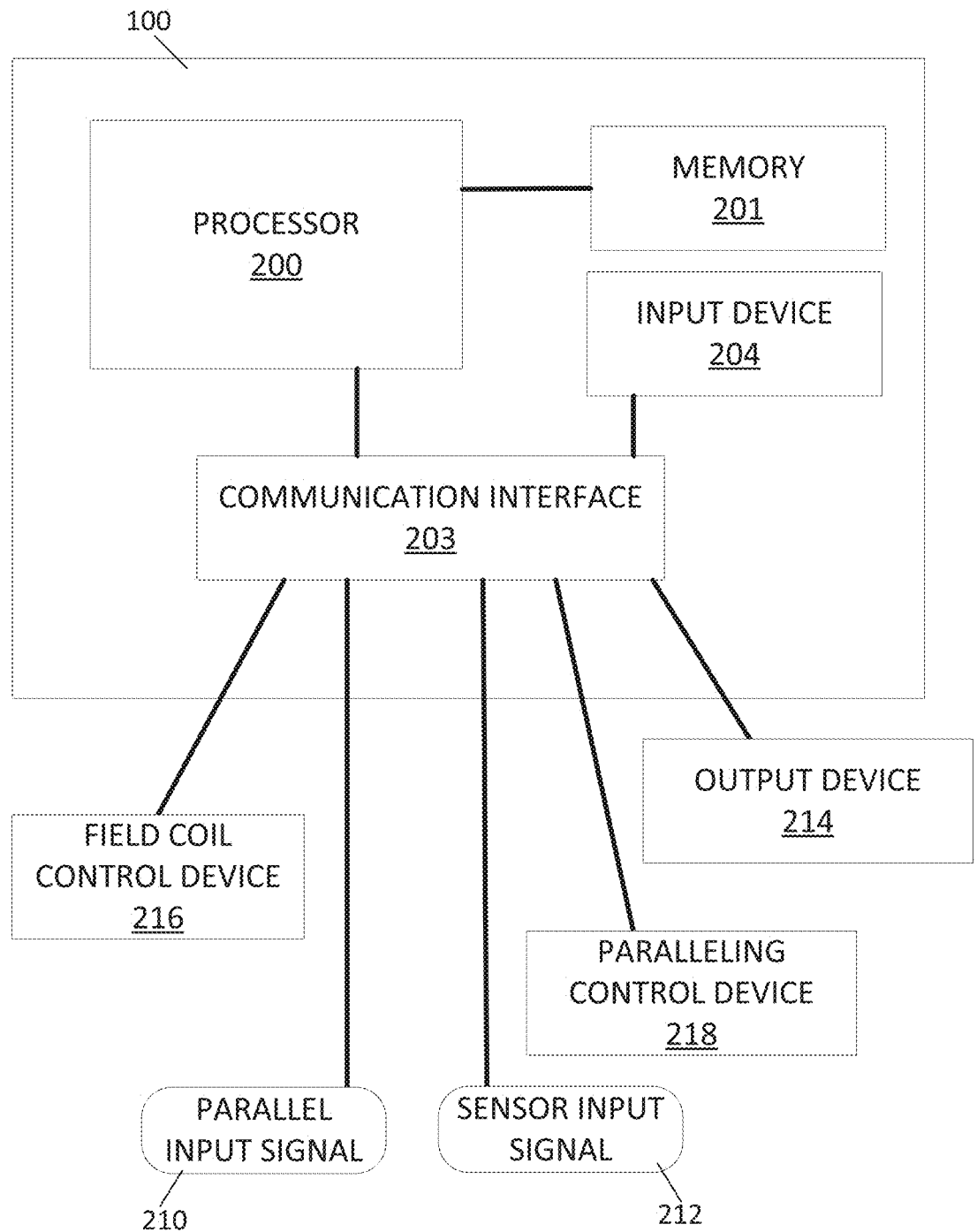
FIG. 17 illustrates an example generator controller.

FIG. 17 illustrates an example controller (e.g., generator controller 100). The controller may include a processor 200, a memory 201, and a communication interface 203. The communication interface 203 may communicate with a parallel input signal 210, a sensor input signal 212, a display device 214, an input device 204, field coil control device 216, and a paralleling control device 218. Additional, different, or fewer components may be included.

Figure 18:
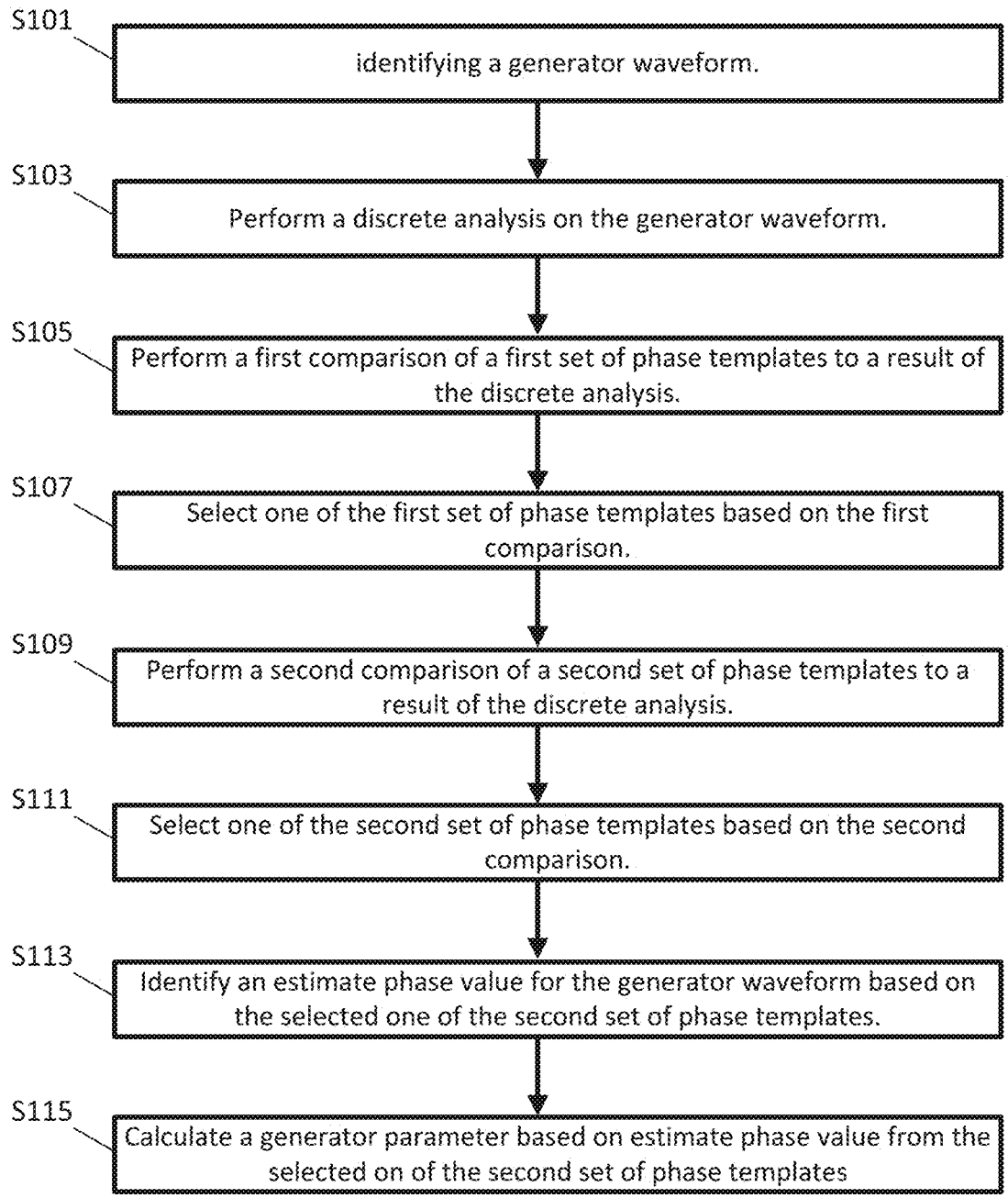
FIG. 18 illustrates an example flowchart for operation of the generator controller of FIG. 17.

FIG. 18 illustrate an example flowchart for operation of the controller of FIG. 17 for iteratively analyzing operation of a generator. Additional, different, or fewer acts may be included.

At act S101, the processor 200 identifies a generator waveform. The generator waveform may be received from the sensor input signal 212 from a sensor associated with the output of the generator. Alternatively, the generator waveform may be received from the sensor input signal 212 from a sensor associated with the field current of the alternator, or a magnetic field induced from the rotor or stator of the alternator. The generator waveform may be received from another generator from parallel input signal 210. The generator waveform from the parallel input signal 210 is used to parallel or synchronize two or more generators. In order to identify the sensed signal as the generator waveform, the processor may compare the amplitude of the waveform to a positive threshold and a negative threshold to determine that the amplitude is both greater than the positive threshold and less than the negative threshold within a predetermined time period.

At act S103, the processor 200 performs a discrete analysis on the generator waveform. The discrete analysis may include taking samples of the generator waveform and creating a sensor data array that represents the generator waveform. The samples may be collected at a sampling rate, which may be accessed from memory 201, or received by the input device 204. Example sample rates include 600 Hz, 1000 Hz, 10 kHz, or 44.1 kHz. The discrete analysis of the generator waveform may including a filtering process that removes outliers or noise from the sample data. The discrete analysis may adjust the data to a predefined format.

The processor 200 may identify one or more phase templates to analyze the measured generator waveform. The templates are ideal sinusoidal waves, or template date arrays that represent the ideal sinusoidal waves, at varying phase offsets, fundamental frequencies, amplitudes, or harmonic frequencies.

The full set of templates may include an array for each possible whole number degree of offset. That is, the set of templates may include a waveform a 1 degree offset, a waveform at 2 degrees offset, a waveform at 3 degrees offset, and so on. Alternatively, the set of templates may include waveforms at offset intervals (e.g., 10 degree intervals), including a waveform a 0 degree offset, a wave form at 10 degrees offset, a waveform at 20 degrees offset, and so on. Each of the templates may be associated in memory with data value for the phase offset, amplitude or frequency. Alternatively, the templates may be calculated as needed, at startup, when the processor has available computational overhead, or at some other time. The templates and comparison may be done in hardware. The phase, frequency and amplitude may be controlled by software or completely contained within the hardware.

At act S105, the processor 200 performs a first comparison of a first set of phase templates to a result of the discrete analysis of the generator waveform. The first set of phase templates may span the possible waveform offset at any interval. In the smallest example the first set of phase templates includes templates at 0 degrees and 180 degrees. In one efficient example, the first set of templates includes 16 templates, evenly spaced at an offset interval between 0 degrees and 360 degrees.

The first comparison of the first set of phase templates with the generator waveform may be a geometric or algebraic comparison to determine how similar each of the first set of phase templates with the generator waveform. The comparison may include a summation of difference in individual points in the sensor data array and the template.

At act S107, the processor 200 selects one of the first set of phase templates based on the first comparison. The selected phase template is the template deemed to have the most similarity with the generator waveform. The difference between the selected phase template and the generator waveform is minimized in the analysis of act S107. The processor 200 selects a phase template for a second set of phase templates based on the selected phase template from the first set of templates. The second set of phase templates may include one template to any number of templates. The second set of phase templates includes at least one template that is closest to the selected phase template from the first set of templates. An interval between templates in the second set of templates is less than the time interval between templates in the first set of templates.

At act S109, the processor 200 performs a second comparison of a second set of phase templates to a result of the discrete analysis of the generator waveform. The second comparison may include a summation of difference in individual points in the sensor data array and one or more of the second templates.

At act S111, the processor 200 selects one of the second set of waveform templates based on the second comparison. The processor 200 may compare the differences between the points in each of the second set of templates and determines which of the templates has the smallest difference. Acts S109 and S111 may be repeated through any number of iteration using subsequent sets of templates having progressively smaller characteristic (e.g., phase, frequency, or amplitude) intervals between templates. The selected waveform from the second set of waveforms, or the final set of waveform when more iterations are used, is designated as the estimate of the measured generator waveform.

At act S113, the processor 200 identifies an estimated characteristic value for the generator waveform based on the selected one of the second set of phase templates. The characteristic value that estimates the offset measured generator waveform. The processor 200 may access a value from memory 201 that is associated with the selected waveform.

At act S115, the processor 200 calculates a generator parameter based on the characteristic value from the selected on of the second set of phase templates. The generator parameter may be an indication whether the generator is operating normally. For example, the processor 200 may compare the characteristic value to a normal range of phase values based on the operation of the engine 19 and the alternator 15. When the characteristic value is outside of the normal range, the generator parameter indicates a malfunction. The processor 200 may change an operating parameter of the engine 19 or alternator 15 based on the generator parameter.

The generator parameter may be an instruction for paralleling the generator to a bus. When the characteristic value is within a normal range for closing to the bus, the processor 200 generates the instruction for a breaker to close to the bus. The generator parameter may be an instruction to adjust a field current. When the characteristic value is greater than an expected value for the phase offset, the processor 200 may increase the frequency of the field current, and when the characteristic value is less than an expected value for the phase offset, the processor 200 may decrease the frequency of the field current.

Figure 19:
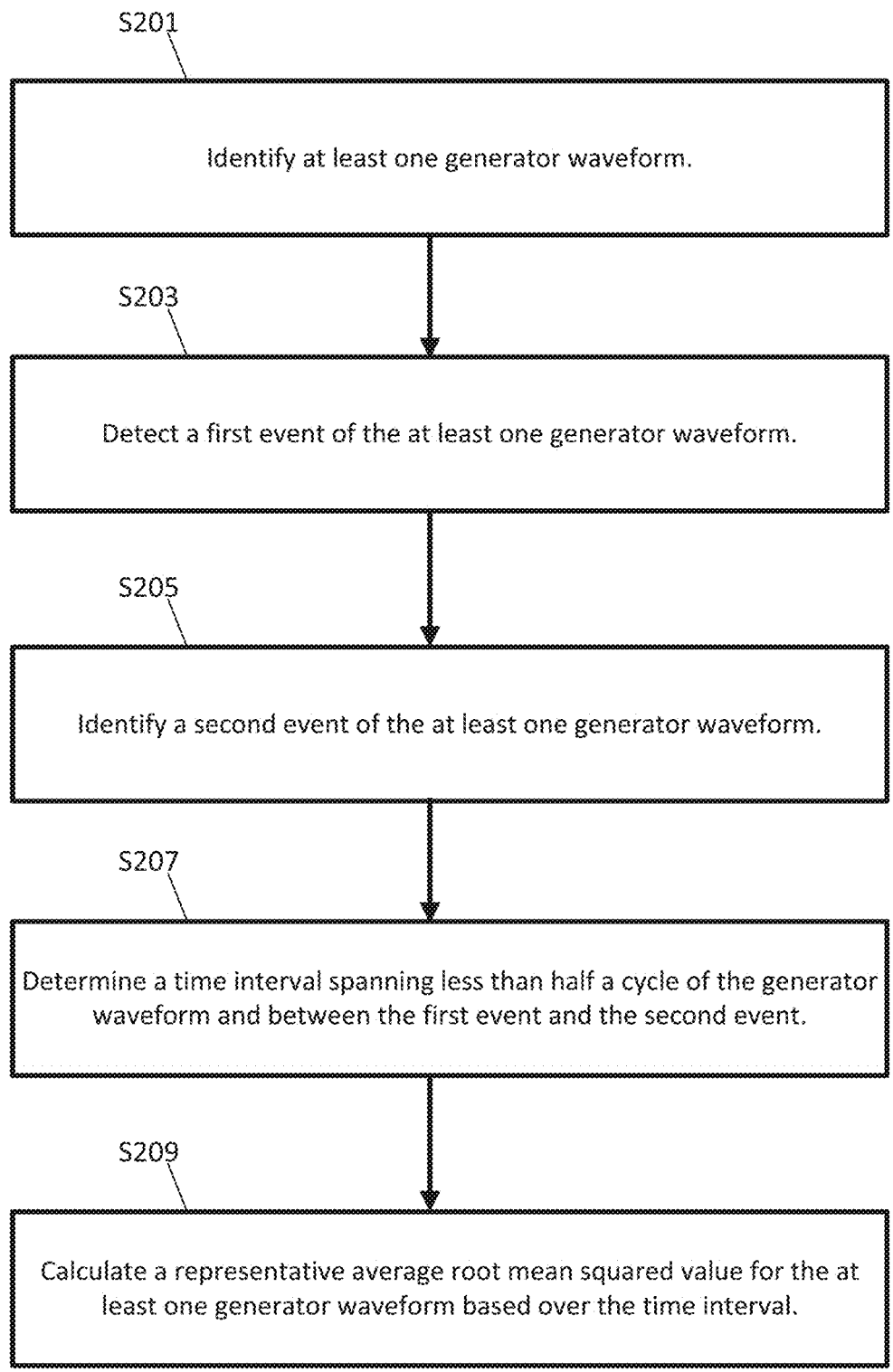
FIG. 19 illustrates another example flowchart for operation of the generator controller of FIG. 17.

FIG. 19 illustrates an example flowchart for operation of the controller of FIG. 17 for determining a representative average root mean squared value for a generator. Additional, different, or fewer acts may be included.

At act S201, the processor 200 identifies at least one generator waveform. The generator waveform may be received from the sensor input signal 212 from a sensor associated with the output of the generator. Alternatively, the generator waveform may be received from the sensor input signal 212 from a sensor associated with the field current of the alternator, or a magnetic field induced from the rotor or stator of the alternator. In order to identify the sensed signal as the generator waveform, the processor may compare the amplitude of the waveform to a positive threshold and a negative threshold to determine that the amplitude is both greater than the positive threshold and less than the negative threshold within a predetermined time period.

At act S203, the processor 200 identifies a first event of the at least one generator waveform. At act S205, the processor 200 identifies a second event of the at least one generator waveform. The first event and the second event may be characteristics of the same phase of the generator waveform or characteristics of different phases of the generator waveform. The characteristic of the waveform may be a change in curvature of the waveform or another type of critical point described above.

At act S207, the processor 200 determines a time interval between the first event and the second event. The time interval spans less than a half cycle of the at least one generator waveform. At act S209, the processor 200 calculates a representative average root mean squared value for the at least one generator waveform based over the time interval.

The processor 200 may determine a generator command from the root mean squared value. The generator command may be an alternator command that adjusts the operation of the alternator 15, an engine command that adjusts the operation of the engine 19, or a generator system command that adjusts the interaction of multiple generators of a generator system.

One example alternator command adjusts the field current of the alternator 15. The field coil control device 216 may generate a field current for driving the field coils of the alternator 15. The amplitude of the field current or the frequency of the field current may be adjusted by the field coil control device 216. The field coil control device 216 may include an amplifier circuit and/or oscillator for controlling the field current. An input to the field coil control device 216 may be a battery, an inductive source, or another source.

The output device 214 may present the root mean squared value or the generator parameter. The output device 214 may include a digital readout, an analog gauge, or a graphical display for displaying the root mean squared value or the generator parameter. The graphical display may illustrate a phasor diagram including the phase offset and amplitude for the measured waveform. The phasor diagram may include vectors for representing the voltage and/or current of the measured waveform.

The paralleling control device 218 may provide a paralleling signal based on the root mean squared value or the generator parameter. The paralleling signal may instruct a breaker to bring the generator in electrical connection with another generator or with a bus. The processor 200 may compare the root mean squared value to an amplitude threshold and the characteristic value to an offset threshold and generator the paralleling signal for the paralleling control device 218 based on the comparisons.

The processor 200 may record values for the generator parameter from the estimate offset value and/or the root mean squared values in a data log stored in memory 201. The logged values may be associated with time stamps. The logged values may be reported through communication interface 203 to a remote monitoring system or remote control system. The processor 200 may also perform protective functions based on the generator parameter from the estimate offset value and/or the root mean squared values. The processor 200 may perform comparisons with a normal range for the offset values or root mean square values and generate an alert when measured values fall outside of the normal range. Alternatively, the processor 200 may generate a shutdown command to disconnect the generator from a bus or ground the ignition of the engine when measured values fall outside of the normal range.

The processor 200 may include a general processor, digital signal processor, an application specific integrated circuit (ASIC), field programmable gate array (FPGA), analog circuit, digital circuit, combinations thereof, or other now known or later developed processor. The processor 200 may be a single device or combinations of devices, such as associated with a network, distributed processing, or cloud computing.

The memory 201 may be a volatile memory or a non-volatile memory. The memory 201 may include one or more of a read only memory (ROM), random access memory (RAM), a flash memory, an electronic erasable program read only memory (EEPROM), or other type of memory. The memory 201 may be removable from the network device, such as a secure digital (SD) memory card.

In addition to ingress ports and egress ports, the communication interface 303 may include any operable connection. An operable connection may be one in which signals, physical communications, and/or logical communications may be sent and/or received. An operable connection may include a physical interface, an electrical interface, and/or a data interface.

The communication interface 203 may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 201) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Processors suitable for the execution of a computer program include, by way of example, both general and special purpose microprocessors, and anyone or more processors of any kind of digital computer. Generally, a processor may receive instructions and data from a read only memory or a random access memory or both. The essential elements of a computer are a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

We claim:

1. A method comprising:
    identifying, by a generator controller, at least one generator waveform from an output of an alternator associated with an engine;
    determining, by the generator controller, a time interval that spans less than a half cycle of the at least one identified generator waveform;
    calculating, by the generator controller, a statistical parameter for the at least one identified generator waveform based on the determined time interval that spans less than the half cycle of the at least one identified generator waveform; and
    determining, by the generator controller, a feedback command that adjusts an operation of the engine or the alternator in response to the calculated statistical parameter.

2. The method of claim 1, wherein the calculated statistical parameter is a root mean square (RMS) value.

3. The method of claim 2, wherein the RMS value is the square root of the sum of the mean of squares of a set of samples spanning the time interval of the at least one generator waveform for less than the half cycle of the at least one identified generator waveform.

4. The method of claim 1, wherein the at least one identified generator waveform includes a three phase waveform.

5. The method of claim 4, wherein the determined time interval spans one twelfth cycle of the at least one identified generator waveform.

6. The method of claim 4, wherein calculating the statistical parameter for the at least one generator waveform based on the determined time interval further comprises:
combining a portion of a first phase of the three phase waveform with a portion of a second phase of the three phase waveform for the statistical parameter.

7. The method of claim 1, further comprising:
measuring at least one curvature change in the at least one identified generator waveform, wherein the determined time interval is bounded by the at least one curvature change.

8. The method of claim 1, further comprising:
measuring at least one zero crossing in the at least one identified generator waveform, wherein the determined time interval is bounded by the at least one zero crossing.

9. The method of claim 1, further comprising:
measuring at least one algebraic critical point of the at least one identified generator waveform, wherein the determined time interval is bounded by the at least one measured algebraic critical point and wherein the at least one measured algebraic critical point comprises a zero crossing of the at least one generator waveform, a local maximum of the at least one generator waveform, a local minimum of the at least one generator waveform, or an inflection point of the at least one generator waveform.

10. The method of claim 1, further comprising:
comparing the at least one identified generator waveform to a template, wherein the determined time interval corresponds to the template.

11. The method of claim 1, wherein the feedback command adjusts a throttle of the engine.

12. The method of claim 1, wherein the feedback command adjusts a field current of the alternator.

13. The method of claim 1, wherein the feedback command closes the alternator to a bus.

14. An apparatus including a memory and a processor, the memory having a set of instructions for execution by the processor to perform a method comprising:
identifying, by a generator controller, at least one generator waveform from an output of an alternator associated with an engine;
determining, by the generator controller, a time interval that spans less than a half cycle of the at least one identified generator waveform;
calculating, by the generator controller, a statistical parameter for the at least one identified generator waveform based on the determined time interval that spans less than the half cycle of the at least one identified generator waveform; and
determining, by the generator controller, a feedback command that adjusts an operation of the engine or the alternator in response to the calculated statistical parameter.

15. A non-transitory computer-readable medium configured to store a set of instructions for execution by a processor or that cause the processor to perform a method comprising:
identifying, by a generator controller, at least one generator waveform from an output of an alternator associated with an engine;
determining, by the generator controller, a time interval that spans less than a half cycle of the at least one identified generator waveform;
calculating, by the generator controller, a statistical parameter for the at least one identified generator waveform based on the determined time interval that spans less than the half cycle of the at least one identified generator waveform; and
determining, by the generator controller, a feedback command that adjusts an operation of the engine or the alternator in response to the calculated statistical parameter.

* * * * *